(12) United States Patent
Bozdag et al.

(10) Patent No.: US 10,803,916 B2
(45) Date of Patent: Oct. 13, 2020

(54) METHODS AND SYSTEMS FOR WRITING TO MAGNETIC MEMORY DEVICES UTILIZING ALTERNATING CURRENT

(71) Applicant: SPIN MEMORY, INC., Fremont, CA (US)

(72) Inventors: Kadriye Deniz Bozdag, Sunnyvale, CA (US); Marcin Gajek, Berkeley, CA (US); Michail Tzoufras, Sunnyvale, CA (US); Eric Michael Ryan, Fremont, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/859,256

(22) Filed: Dec. 29, 2017

(65) Prior Publication Data

US 2019/0206472 A1 Jul. 4, 2019

(51) Int. Cl.
| | |
|---|---|
| *G11C 11/00* | (2006.01) |
| *G11C 11/16* | (2006.01) |
| *H01L 27/22* | (2006.01) |
| *H01L 43/08* | (2006.01) |
| *H01F 10/32* | (2006.01) |
| *H01L 43/10* | (2006.01) |
| *H01L 43/12* | (2006.01) |

(52) U.S. Cl.
CPC ........ *G11C 11/1675* (2013.01); *G11C 11/161* (2013.01); *H01F 10/3286* (2013.01); *H01L 27/228* (2013.01); *H01L 43/08* (2013.01); *H01F 10/329* (2013.01); *H01L 43/10* (2013.01); *H01L 43/12* (2013.01)

(58) Field of Classification Search
CPC ............... G11C 11/1675; G11C 11/161; H01F 10/3286; H01F 10/329; H01L 27/228; H01L 43/08
USPC ....................................................... 365/158
See application file for complete search history.

(56) References Cited

U.S. PATENT DOCUMENTS

| | | |
|---|---|---|
| 4,910,709 A | 3/1990 | Dhong et al. |
| 5,308,782 A | 5/1994 | Mazure et al. |

(Continued)

OTHER PUBLICATIONS

Beleggia et al., "Phase Diagram for Magnetic Nano-Rings, May 27, 2005, Journal of Magnetism and Magnetic Materials," 16 pgs.

(Continued)

*Primary Examiner* — Viet Q Nguyen
(74) *Attorney, Agent, or Firm* — Morgan, Lewis & Bockius LLP

(57) ABSTRACT

A method for selectively writing to STT-MRAM using an AC current is provided. The method is performed in a memory device including two or more multilevel magnetic tunnel junctions (MTJs) arranged in series with respect to a single terminal of a transistor, where the two or more multilevel MTJs include a first MTJ having a first magnetic characteristic and first electrical characteristic and a second MTJ having a second magnetic characteristic that is distinct from the first magnetic characteristic and a second electrical characteristic. The method includes writing to an MTJ. The writing includes applying a DC current to the two or more MTJs and applying an AC current to the two or more MTJs, where the AC current is adjusted to a frequency that is tuned to a write assist frequency corresponding to the respective MTJ.

14 Claims, 14 Drawing Sheets

(56) References Cited

U.S. PATENT DOCUMENTS

| | | | | |
|---|---|---|---|---|
| 5,656,842 | A | 8/1997 | Iwamatsu et al. | |
| 5,717,373 | A | 2/1998 | Vachris | |
| 6,621,730 | B1 | 9/2003 | Lage | |
| 6,829,161 | B2* | 12/2004 | Huai | G11C 11/16 365/158 |
| 6,909,631 | B2 | 6/2005 | Durlam et al. | |
| 7,067,866 | B2 | 6/2006 | Shi | |
| 7,166,881 | B2 | 1/2007 | Lin et al. | |
| 7,224,601 | B2* | 5/2007 | Panchula | B82Y 25/00 365/158 |
| 7,248,498 | B2 | 7/2007 | Nazarian | |
| 7,577,019 | B2 | 8/2009 | Hung et al. | |
| 7,800,938 | B2* | 9/2010 | Rivkin | H03B 15/006 365/158 |
| 7,826,260 | B2 | 11/2010 | Zhu et al. | |
| 7,872,905 | B2* | 1/2011 | Florez Marino | G11C 11/5607 257/421 |
| 7,881,099 | B2* | 2/2011 | Lim | B82Y 25/00 365/158 |
| 7,936,597 | B2 | 5/2011 | Clinton et al. | |
| 8,008,706 | B2 | 8/2011 | Choi et al. | |
| 8,077,509 | B2* | 12/2011 | Yanagi | G11B 25/04 257/379 |
| 8,107,280 | B2 | 1/2012 | Yoon et al. | |
| 8,179,711 | B2 | 5/2012 | Kim et al. | |
| 8,194,361 | B2* | 6/2012 | Kudo | B82Y 25/00 360/324.11 |
| 8,199,553 | B2* | 6/2012 | Chen | G11C 11/1659 365/130 |
| 8,203,389 | B1* | 6/2012 | Zhou | H03B 15/006 331/3 |
| 8,345,474 | B2 | 1/2013 | Oh et al. | |
| 8,353,568 | B2 | 1/2013 | Lee | |
| 8,416,539 | B2* | 4/2013 | Carey | B82Y 10/00 360/324.11 |
| 8,421,440 | B2* | 4/2013 | Oksanen | G01R 33/1284 324/76.11 |
| 8,508,973 | B2* | 8/2013 | Jin | H01L 43/08 365/145 |
| 8,582,240 | B1* | 11/2013 | Chen | G11B 5/399 360/125.3 |
| 8,587,993 | B2 | 11/2013 | Lee et al. | |
| 8,625,337 | B2 | 1/2014 | Wu et al. | |
| 8,633,720 | B2* | 1/2014 | Tudosa | G01R 33/093 324/230 |
| 8,724,380 | B1 | 5/2014 | Zhou et al. | |
| 9,110,746 | B2* | 8/2015 | Zhu | G06F 7/588 |
| 9,142,277 | B2 | 9/2015 | Kim et al. | |
| 9,166,147 | B2* | 10/2015 | Carman | H01L 41/1875 |
| 9,208,878 | B2 | 12/2015 | Iyer et al. | |
| 9,230,571 | B1* | 1/2016 | Chen | G11B 5/314 |
| 9,236,416 | B2 | 1/2016 | Shukh | |
| 9,240,799 | B1* | 1/2016 | Wang | H03M 1/142 |
| 9,337,415 | B1 | 5/2016 | Oh et al. | |
| 9,362,336 | B2 | 6/2016 | Lu | |
| 9,437,272 | B1 | 9/2016 | Lu et al. | |
| 9,443,905 | B1 | 9/2016 | Bandic et al. | |
| 9,444,036 | B1 | 9/2016 | Franca-Neto | |
| 9,460,769 | B2* | 10/2016 | Nozaki | H01L 29/66984 |
| 9,461,094 | B2 | 10/2016 | Li et al. | |
| 9,502,133 | B2 | 11/2016 | Ueda et al. | |
| 9,503,097 | B2* | 11/2016 | Lee | H03K 19/18 |
| 9,525,126 | B1 | 12/2016 | Lin | |
| 9,543,505 | B2 | 1/2017 | Park et al. | |
| 9,595,917 | B2* | 3/2017 | Kan | H03B 15/006 |
| 9,608,043 | B2 | 3/2017 | Shimabukuro et al. | |
| 9,634,237 | B2 | 4/2017 | Lee et al. | |
| 9,637,272 | B2 | 5/2017 | Albaum | |
| 9,660,183 | B2* | 5/2017 | Wang | H01L 43/08 |
| 9,678,178 | B2 | 6/2017 | Bal et al. | |
| 9,734,882 | B2 | 8/2017 | Toh et al. | |
| 9,741,926 | B1 | 8/2017 | Pinarbasi et al. | |
| 9,766,705 | B2* | 9/2017 | Chan | G06F 3/0362 |
| 9,773,913 | B1 | 9/2017 | Balakrishnan et al. | |
| 9,799,383 | B2 | 10/2017 | Hosotani et al. | |
| 9,852,800 | B2 | 12/2017 | Lang et al. | |
| 9,853,206 | B2* | 12/2017 | Pinarbasi | H01L 43/08 |
| 9,881,970 | B2 | 1/2018 | Chung | |
| 10,026,892 | B2* | 7/2018 | Pinarbasi | H01L 43/08 |
| 10,109,367 | B2 | 10/2018 | Raberg | |
| 10,199,083 | B1* | 2/2019 | Bozdag | G11C 11/1659 |
| 10,229,724 | B1 | 3/2019 | El Baraji et al. | |
| 10,236,047 | B1* | 3/2019 | Ryan | G11C 11/161 |
| 10,236,048 | B1* | 3/2019 | Tzoufras | G11C 11/1675 |
| 10,255,962 | B1* | 4/2019 | El Baraji | G11C 11/1675 |
| 10,326,073 | B1 | 6/2019 | Tzoufras et al. | |
| 10,347,308 | B1* | 7/2019 | Bozdag | G11C 11/15 |
| 2003/0183889 | A1 | 10/2003 | Kajiyama | |
| 2004/0026307 | A1 | 2/2004 | Tamura | |
| 2004/0047204 | A1 | 3/2004 | Hung et al. | |
| 2005/0073878 | A1 | 4/2005 | Lin et al. | |
| 2005/0184348 | A1 | 8/2005 | Youn et al. | |
| 2005/0232006 | A1 | 10/2005 | Iwata | |
| 2006/0152969 | A1 | 7/2006 | Trouilloud | |
| 2007/0047294 | A1* | 3/2007 | Panchula | B82Y 25/00 365/158 |
| 2007/0171694 | A1 | 7/2007 | Huai et al. | |
| 2007/0201265 | A1 | 8/2007 | Ranjan et al. | |
| 2007/0210338 | A1 | 9/2007 | Orlowski | |
| 2009/0032849 | A1 | 2/2009 | Higashino | |
| 2009/0097298 | A1 | 4/2009 | Klostermann | |
| 2010/0003767 | A1 | 1/2010 | Cho | |
| 2010/0052029 | A1 | 3/2010 | Huang | |
| 2010/0102290 | A1 | 4/2010 | Lu et al. | |
| 2010/0187601 | A1 | 7/2010 | Masuoka et al. | |
| 2011/0062515 | A1 | 3/2011 | Masuoka et al. | |
| 2011/0089496 | A1 | 4/2011 | Masuoka et al. | |
| 2012/0155164 | A1 | 6/2012 | Shukh | |
| 2012/0217468 | A1 | 8/2012 | Tekleab et al. | |
| 2012/0313742 | A1 | 12/2012 | Kurs et al. | |
| 2013/0200467 | A1 | 8/2013 | Edge et al. | |
| 2013/0258763 | A1 | 10/2013 | Ranjan et al. | |
| 2014/0008606 | A1 | 1/2014 | Hussain et al. | |
| 2014/0050019 | A1 | 2/2014 | Lee et al. | |
| 2014/0103470 | A1 | 4/2014 | Shukh | |
| 2014/0151830 | A1 | 6/2014 | Apalkov et al. | |
| 2014/0151831 | A1 | 6/2014 | Chen et al. | |
| 2014/0169085 | A1 | 6/2014 | Wang et al. | |
| 2014/0170821 | A1 | 6/2014 | Nyhus et al. | |
| 2014/0175577 | A1 | 6/2014 | Apalkov et al. | |
| 2014/0264513 | A1 | 9/2014 | De Brosse et al. | |
| 2014/0264552 | A1 | 9/2014 | Prabhakar et al. | |
| 2015/0021675 | A1 | 1/2015 | Min | |
| 2015/0138873 | A1 | 5/2015 | Lu et al. | |
| 2015/0279904 | A1 | 10/2015 | Pinarbasi et al. | |
| 2015/0333254 | A1* | 11/2015 | Liu | G01R 33/096 438/3 |
| 2016/0079361 | A1 | 3/2016 | Ching et al. | |
| 2016/0225818 | A1 | 8/2016 | Toh et al. | |
| 2016/0240533 | A1 | 8/2016 | Oxland | |
| 2016/0240542 | A1 | 8/2016 | Kwon | |
| 2016/0274198 | A1* | 9/2016 | Naik | G01R 33/098 |
| 2016/0315249 | A1 | 10/2016 | Kardasz et al. | |
| 2016/0372656 | A1 | 12/2016 | Pinarbasi et al. | |
| 2017/0005106 | A1 | 1/2017 | Zhang | |
| 2017/0178705 | A1 | 6/2017 | Buhrman et al. | |
| 2017/0317070 | A1 | 11/2017 | Salcedo et al. | |
| 2018/0075895 | A1 | 3/2018 | Kishi et al. | |
| 2018/0096896 | A1 | 4/2018 | Zhu | |
| 2018/0248110 | A1* | 8/2018 | Kardasz | H01L 43/10 |
| 2018/0269210 | A1 | 9/2018 | Tezuka et al. | |
| 2018/0308534 | A1 | 10/2018 | Gaudin et al. | |
| 2019/0036013 | A1 | 1/2019 | Mo et al. | |
| 2019/0096957 | A1 | 3/2019 | Uchida et al. | |
| 2019/0206465 | A1* | 7/2019 | Bozdag | G11C 11/161 |
| 2019/0207094 | A1 | 7/2019 | Gajek et al. | |
| 2019/0207102 | A1 | 7/2019 | Gajek et al. | |
| 2019/0214431 | A1 | 7/2019 | Sharma et al. | |
| 2019/0273202 | A1 | 9/2019 | Nikitin et al. | |

(56) References Cited

U.S. PATENT DOCUMENTS

2019/0296223 A1   9/2019   Araki
2019/0311956 A1   10/2019  Sharma et al.

OTHER PUBLICATIONS

Bhatti et al., "Spintronics based random access memory: a review," Materials Today, vol. 20, No. 9, 530-548, Nov. 2017, from http://dx.doi.org/10.1016/j.mattod.2017.07.007, 19 pgs.
Chen et al., "On-Chip Caches Built on Multilevel Spin-Transfer Torque RAM Cells and Its Optimizations," ACMJournal on Emerging Technologies in Computing Systems, vol. 9, No. 2, Article 16, May 2013, 22 pgs.
Chen et al., "Processor Caches Built Using Multi-Level Spin-Transfer Torque RAM Cells," Jun. 2011 © 2011 IEEE, 6 pgs.
Dyakonov, M. I., "Spin Hall Effect," arXiv:1210.3200v1 (2010), from https://arxiv.org/ftp/arxiv/papers/1210/1210.3200.pdf, 12 pgs.
Eitan et al., "NROM: A Novel Localized Trapping, 2-Bit Nonvolatile Memory Cell," IEEE Electron Device Letters, vol. 21, No. 11, Nov. 2000, 3 pgs.
Fernandez-Pacheco et al., "Three-dimensional nanomagnetism," Nat. Comm. 8, 15756 ( 2017).
Jiang et al., "Constructing Large and Fast Multi-Level Cell STT-RAM based Cache for Embedded Processors," DAC 20125, Jun. 3-7, 2012, San Francisco, California, 6 pgs.
Laczkowski et al., "Large enhancement of the spin Hall effect in Au by side-jump scattering on Ta impurities," Phys. Rev. B 96, 140405(R) (2017).
Lavrijsen et al., "Magnetic ratchet for three-dimensional spintronic memory and logic," Nature 493, pp. 647-650 (2013).
Lavrijsen et al., "Multi-bit operations in vertical spintronic shift registers," Nanotechnology 25, 105201 (2014).
Lavrijsen et al., "Tuning the interlayer exchange coupling between single perpendicularly magnetized CoFeB layers," Appl. Phys. Lett. 100, 052411 (2012).
Lee et al., "Domain Imaging During Soliton Propagation in a 3D Magentic Ratchet," Spin 3(4), 1340013 (2013).
Lee et al., "Soliton propagation in micron-sized magnetic ratchet elements," Appl. Phys. Lett. 104, 232404 (2014).
Li Gao, "Spin Polarized Current Phenomena in Magnetic Tunnel Junctions," Ph.D. Dissertation, Stanford University, Sep. 2009, 126 pgs.
Li et al., A New Self-reference Sensing Scheme for TLC MRAM, Sep. 2015 © 2015 IEEE, 4 pgs.
Mansell et al., "A magnetic shift register with out-of-plane magnetized layers," Nanotechnology 28, 385201 (2017).
Mansell et al., "A robust soliton ratchet using combined antiferromagnetic and ferromagnetic interlayer couplings," Appl. Phys. Lett. 106, 092404 (2015).
Parkin, "Systematic Variation of the Strength and Oscillation Period of Indirect Magnetic Exchange Coupling through the 3d, 4d, and 5d Transition Metals," Phys. Rev. Lett. 67(25), pp. 3598-3601 (1991).
Petit et al., "Systematic layer-by-layer characterization of multilayers for three-dimensional data storage and logic," Nanotechnology 27, 155203 (2016).
Sbiaa et al., "Materials with perpendicular magnetic anisotropy for magnetic random access memory," Phys. Status Solidi RRL 5, No. 12, 413-419 (2011) / DOI: 10.1002/pssr.201105420, 7 pgs.
Van den Brink et al., "Spin-Hall-assisted magnetic random access memory," Applied Physics Letters, 104, 012403 (2014), 4 pgs.
Vincent et al., "Spin-Transfer Torque Magnetic Memory as a Stochastic Memristive Synapse for Neuromorphic Systems," IEEE Transactions on Biomedical Circuits and Systems, vol. 9, No. 2, Apr. 2015, 9 pgs.
Wang et al., "Spintronic materials and devices based on antiferromagnetic metals," Progress in Natural Science: Materials International, Oct. 23, 2016, 27 (2017) 208-216, 9 pgs.
Yuen et al., "A 2-Bit MONOS Nonvolatile Memory Cell Based on Asymmetric Double Gate Mosfet Structure," IEEE Electron Device Letters, vol. 24, No. 8, Aug. 2003, 3 pgs.
Zhang et al., "MLC STT-RAM Design Considering Probabilistic and Asymmetric MTJ Switching," Mar. 2013 © 2013 IEEE, 4 pgs.
Zhang et al., Multi-level Cell STT-RAM: Is it Realistic or Just a Dream?, IEEE/ACM International Conference on Computer-Aided Design, Nov. 5-8, 2012, San Jose, California, 8 pgs.
Bozdag, Office Action dated Jul. 18, 2018, U.S. Appl. No. 15/859,259, 15pgs.
Bozdag, Final Office Action dated Dec. 3, 2018, U.S. Appl. No. 15/859,259, 14 pgs.
Kim, Office Action dated Sep. 17, 2018, U.S. Appl. No. 15/865,125, 10 pgs.
Sharma, Notice of Allowance dated Sep. 25, 2018, U.S. Appl. No. 15/865,140, 10 pgs.
Sharma, Notice of Allowance dated Sep. 13, 2018, U.S. Appl. No. 15/865,138, 17 pgs.
Sharma, Notice of Allowance dated Sep. 26, 2018, U.S. Appl. No. 15/865,132, 11 pgs.
Sharma, Notice of Allowance dated Sep. 24, 2018, U.S. Appl. No. 15/865,123, 11 pgs.
Tzoufras, Office Action dated Sep. 27, 2018, U.S. Appl. No. 15/859,157,14 pgs.
Tzoufras, Office Action dated Nov. 9, 2018, U.S. Appl. No. 15/858,808, 8 pgs.
Bozdag, Notice of allowance dated Feb. 13, 2019, U.S. Appl. No. 15/859,259, 9 pgs.
Bozdag, Office Action, U.S. Appl. No. 15/859,250, dated Feb. 1, 2019, 12 pgs.
Bozdag, Notice of Allowance, U.S. Appl. No. 15/859,250, dated Apr. 25, 2019, 9 pgs.
Kim, Notice of Allowance dated Jan. 25, 2019, U.S. Appl. No. 15/865,125, 5 pgs.
Kim, Office Action dated Nov. 28, 2018, U.S. Appl. No. 15/865,144, 9 pgs.
Bozdag, Non-Final Office Action, U.S. Appl. No. 15/859,250, dated Feb. 1, 2019, 10 pgs.
Bozdag, Notice of Allowance, U.S. Appl. No. 15/859,250, dated Apr. 25, 2019, 8 pgs.
Bozdag, Non-Final Office Action, U.S. Appl. No. 15/859,259, dated Jul. 18, 2018, 13 pgs.
Bozdag, Final Office Action, U.S. Appl. No. 15/859,259, dated Dec. 3, 2018, 13 pgs.
Bozdag, Notice of Allowance, U.S. Appl. No. 15/859,259, dated Feb. 13, 2019, 9 pgs.

\* cited by examiner (Parallel Configuration)

(Anti-Parallel Configuration)

METHODS AND SYSTEMS FOR WRITING TO MAGNETIC MEMORY DEVICES UTILIZING ALTERNATING CURRENT

RELATED APPLICATIONS

This application is related to U.S. patent application Ser. No. 15/859,250, entitled "Systems and Methods Utilizing Serial Configurations of Magnetic Memory Devices," filed Dec. 29, 2017, and U.S. patent application Ser. No. 15/859,259, entitled "Systems and Methods Utilizing Parallel Configurations of Magnetic Memory Devices," filed Dec. 29, 2017, each of which is incorporated by reference in its entirety.

TECHNICAL FIELD

This relates generally to the field of memory applications, including but not limited to magnetic memory.

BACKGROUND

Magnetoresistive random access memory (MRAM) is a non-volatile memory technology that stores data through magnetic storage elements. MRAM devices store information by changing the orientation of the magnetization of a storage layer. For example, based on whether the storage layer is in a parallel or anti-parallel alignment relative to a reference layer, either a "1" or a "0" can be stored in each MRAM cell.

The field of memory applications is becoming more challenging as the performance requirements for memory-based devices increase. Because of many useful properties of MRAM (e.g., retention of data, resistance to errors, and life span of memory cells), memory systems based on MRAM have superior performance over conventional memory systems.

SUMMARY

There is a need for systems and/or devices with more efficient, accurate, and effective methods for fabricating and/or operating memory systems. Such systems, devices, and methods optionally complement or replace conventional systems, devices, and methods for fabricating and/or operating memory systems.

The present disclosure describes various implementations of MRAM systems and devices. As discussed in greater detail below, MRAM stores data through magnetic storage elements. These elements typically include two ferromagnetic films or layers that can hold a remnant magnetization and are separated by a non-magnetic material. In general, one of the layers has its magnetization pinned (e.g., a "reference layer"), meaning that this layer possesses a large thermal stability and requires a large magnetic field or spin-polarized current to change the orientation of its magnetization. The second layer is typically referred to as the storage, or free, layer and its magnetization direction can be changed by a smaller magnetic field or spin-polarized current relative to the reference layer.

Due to the spin-polarized electron tunneling effect, the electrical resistance of the cell changes due to the relative orientation of the magnetization of the two layers. A memory cell's resistance will be different for the parallel and anti-parallel states and thus the cell's resistance can be used to distinguish between a "1" and a "0". One important feature of MRAM devices is that they are non-volatile memory devices, since they maintain the information even when the power is off. In particular, the layers can be sub-micron in lateral size and the magnetization direction can still be stable over time and with respect to thermal fluctuations.

Reducing the number of transistors used in memory has always been a challenge. For MTJ architecture, each MTJ having individual transistors limits the pitch of the devices and the density of the MRAM array. As disclosed herein, a denser MRAM array is achieved by arranging two or more STT MTJs in a series configuration with a common transistor.

In some implementations, the switching voltage for both AP to P and P to AP transitions is reduced using an AC current (e.g., to improve the device endurance, and to obtain better write error rates). In some implementations, a vertical stack of MTJs is connected to an AC source with frequency that is selectively tuned to be close to the intrinsic free-layer precession frequencies of the individual devices.

In some implementations, two or more MTJs are fabricated in a series configuration (e.g. on top of one another). In some implementations, these MTJs share a common transistor. In some implementations, each MTJ has a different MTJ resistance (e.g., which can be achieved by varying size or resistance-area (RA) product of the MTJ). By having different MTJ resistances, discrete total resistance values are achieved. In some implementations, each MTJ has a different magnetic anisotropy ($H_{K,eff}$) and thus each bit has a different corresponding AC write assist frequency.

In some implementations, the writing of a bit is performed by selectively adjusting an AC frequency for the desired MTJ such that only the desired bit will be written with an AC excitation and DC current source.

For example, in a two MTJ configuration stack where one MTJ has 4 times the resistance at the parallel configuration, four different resistance states are achieved depending on the states of the MTJs (see Table 1 below).

TABLE 1

Example Relative Resistances for Parallel MTJs

| MTJ1 state | MTJ2 state | MTJ1 resistance | MTJ2 resistance | Total Resistance |
| --- | --- | --- | --- | --- |
| P | P | R | 4R | 5R |
| P | AP | R | 8R | 9R |
| AP | AP | 2R | 8R | 10R |
| AP | P | 2R | 4R | 6R |

In Table 1, MTJ2 has four times (4×) the resistance of MTJ1 when each are measured in the P state. Therefore, a total of 4 different resistance states are available. As illustrated in Table 1, the states of the MTJ can be determined based on the total resistance read out from the stack.

In some implementations, each MTJ will have a different magnetic anisotropy ($H_{K,eff}$). For example, by varying device size and/or readout layer magnetic anisotropy, different delta (thermal stability) and switching current values can be achieved.

In some implementations, a multi-level voltage pulse is used to write to the bit or bits. For example, in a two MTJ configuration where one MTJ has twice the write current threshold ($L_{c0}$) of the other MTJ, a high current will write to both of the MTJs (e.g., write an AP or "1" state to each MTJ). If the lower $I_{c0}$ MTJ should be in the other state (e.g., the P or "0" state), a consecutive lower pulse is applied to write to the lower $I_{c0}$ MTJ.

In some implementations, two or more MTJs are fabricated so as to share the same bottom electrode in parallel configuration and their switching characteristics are tailored (e.g., by adjusting their respective size and the magnetic anisotropy of the storage layer). By tailoring the switching characteristics, each MTJ can be made to have a different resistance (e.g., by varying size or RA product of the MTJ) resulting in discrete total resistance values in the cell depending on the respective magnetic configurations of each of the MTJ's.

In some implementations, the MTJs are configured such that the current drawn does not exceed the characteristics of the common select transistor. In some implementations, one or more additional transistors per cell are used to accommodate higher current requirements.

In accordance with some implementations, for n junctions $2^n$ resistive states can be written. For example, for 2 MTJ's the resistive states are as follows: (P, P) (AP, AP) (P, AP) (AP, P). In some instances, a separation of switching voltage levels for each of the junctions in each cell is needed.

In some implementations, the separation is achieved by varying device size. Varying the device size enables different delta (thermal stability) factors and hence different switching current values for a given pulse width as well as different resistance values if using the same stack and hence the same RA product for both MTJ's.

In some implementations, the separation is achieved by changing the magnetic anisotropy of the storage layer. In some implementations, changing the magnetic anisotropy includes varying the composition and/or the thickness of the storage layer. In some implementations, varying the composition and/or the thickness of the storage layer involves several depositions steps and/or selective doping.

In some implementations, the separation is achieved by changing the RA product of the spacer layer. In some implementations, the separation is achieved by variation of offset field in function of size due to the stray fields from the reference layer.

In one aspect, some implementations include an apparatus comprising: (1) two or more magnetic tunnel junctions (MTJs), including a first MTJ having a first magnetic characteristic and a first electrical characteristic and a second MTJ having a second magnetic characteristic and a second electrical characteristic, where the first magnetic characteristic is distinct from the second magnetic characteristic; (2) a transistor having three terminals, wherein the first MTJ is coupled to a first terminal of the three terminals; and (3) a metallic separator coupling the first MTJ with the second MTJ, where the first MTJ and the second MTJ are arranged in series. By configuring two or more MTJs in series, the number of transistors required is reduced, the footprint for a single MTJ is reduced, and a higher memory array density is achieved.

In another aspect, some implementations include a magnetic storage device having: (1) a magnetic memory cell that includes: (a) two or more magnetic tunnel junctions (MTJs), including a first MTJ having a first magnetic characteristic and a first electrical characteristic and a second MTJ has a second magnetic characteristic and a second electrical characteristic, where the first magnetic characteristic is distinct from the second magnetic characteristic; and (b) a bottom electrode and a top electrode, where the two or more MTJs are arranged in parallel with one another between the top and bottom electrodes; (2) readout circuitry coupled to the bottom electrode or the top electrode of the magnetic memory cell; and (3) write circuitry coupled to the bottom electrode or the top electrode of the magnetic memory cell. By configuring two or more MTJs in parallel, the number of transistors required is reduced, the footprint for a single MTJ is reduced, and a higher memory array density is achieved. By configuring the two or more MTJs in parallel, a same stack can be used for both MTJs and standard MRAM fabrication techniques can be utilized, thus reducing complexity and cost for the memory array.

In yet another aspect, some implementations include a method performed at a memory device including two or more magnetic tunnel junctions (MTJs) arranged in series with respect to a single terminal of a transistor, where the two or more MTJs include a first MTJ having a first magnetic characteristic and first electrical characteristic and a second MTJ having a second magnetic characteristic that is distinct from the first magnetic characteristic and a second electrical characteristic. The method includes writing to an MTJ, including: (1) applying a DC current to the two or more MTJs; and (2) applying an AC current to the two or more MTJs, where the AC current is adjusted to a frequency that is tuned to a write assist frequency corresponding to the respective MTJ. In some implementations, the method is performed at a memory device including two or more MTJs arranged in parallel with one another. In some implementations, by applying an AC current: (1) a reduction in the voltage stress on MTJs is achieved in comparison to a direct-AC current injection scheme; (2) device endurance is improved; (3) device switching properties are improved; and (4) write error rates are reduced.

Thus, devices and systems are provided with methods for fabricating and operating magnetic memory, thereby increasing the effectiveness, efficiency, and user satisfaction with such systems and devices.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

Like reference numerals refer to corresponding parts throughout the several views of the drawings.

DETAILED DESCRIPTION

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

An important factor in memory devices is sizing, where smaller, denser memory devices are preferred. One way to increase density is to reduce the number of transistors in a memory device. Utilizing a memory cell that couples multiple MTJs to a single word line transistor is one way to reduce the total number of transistors. Multiple MTJs can be coupled to a same transistor by arranging the MTJs in series or parallel with one another. In a series or parallel configuration, the individual MTJs are individually written by varying the properties of the MTJs such that each has a distinct write threshold current and a distinct resistance state for readout. Moreover, the state of each MTJ can be determined based on a total read resistance of the memory cell. In accordance with some implementations, by configuring two or more MTJs in parallel or series, the number of transistors required is reduced, the footprint for a single MTJ is reduced, and a higher memory array density is achieved. Moreover, in accordance with some implementations, a same stack can be used for both MTJs and standard MRAM fabrication techniques can be utilized, thus reducing complexity and cost for the memory device.

Figure 1A:
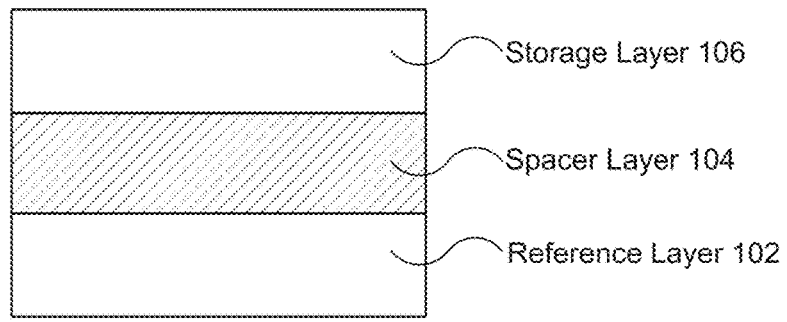
FIG. 1A shows a schematic diagram of a representative magnetic tunnel junction (MTJ) structure in accordance with some implementations.

FIG. 1A is schematic diagram of a magnetic tunnel junction (MTJ) structure 100 (e.g., for use in an MRAM device) in accordance with some implementations. In accordance with some implementations, the MTJ structure 100 is composed of a first ferromagnetic layer (reference layer 102), a second ferromagnetic layer (storage layer 106), and a non-magnetic layer (spacer layer 104). The reference layer 102 is also sometimes referred to as a pinned or fixed layer. The storage layer 106 is also sometimes referred to as a free layer. The spacer layer 104 is also sometimes referred to as a barrier layer. In some implementations, the spacer layer 104 comprises an electrically-conductive material such as a metal. In some implementations, the spacer layer 104 comprises an electrically-insulating material such as magnesium oxide (MgO) or $MgAl_2O_4$.

In some implementations, the reference layer 102 and the storage layer 106 are composed of the same ferromagnetic material. In some implementations, the reference layer 102 and the storage layer 106 are composed of different ferromagnetic materials. In some implementations, the reference layer 102 is composed of a ferromagnetic material that has a higher coercivity and/or thermal stability than the storage layer 106. In some implementations, the reference layer 102 and the storage layer 106 are composed of different ferromagnetic materials with the same or similar thicknesses (e.g., within 10%, 5%, or 1% of one another). In some implementations, the thickness of the reference layer 102 is different from that of the storage layer 106 (e.g., the reference layer 102 is thicker than the storage layer 106). In some implementations, the thickness of the spacer layer 104 is on the order of a few atomic layers. In some implementations, the thickness of the spacer layer 104 is on the order of a few nanometers.

In some implementations, the reference layer 102 and/or the storage layer 106 is composed of two or more ferromagnetic layers that separated from one another with spacer layers. In some implementations, each of these ferromagnetic layers is composed of identical, or varying, thickness(es) and/or material(s). In some implementations, the spacer layers are composed of identical, or varying, thickness(es) and/or material(s) with respect to one another.

Figure 1B:
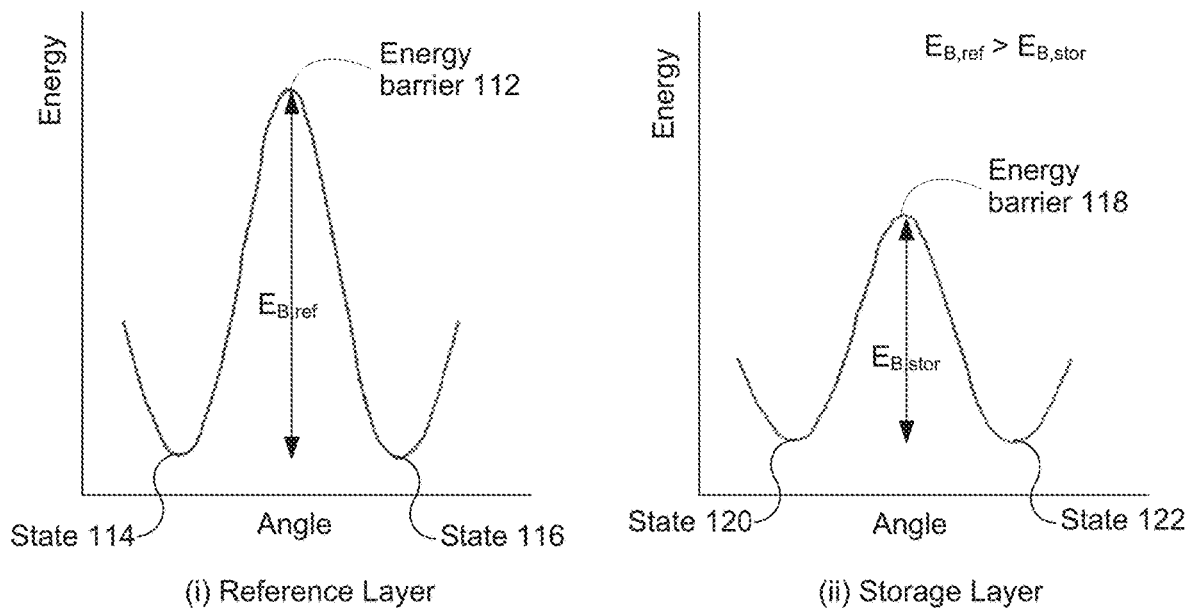
FIG. 1B shows representative energy barriers of the reference and storage layers of the MTJ of FIG. 1A in accordance with some implementations.

Magnetic anisotropy refers to the directional dependence of a material's magnetic properties. The magnetic moment of magnetically anisotropic materials will tend to align with an "easy axis," which is the energetically favorable direction of spontaneous magnetization. In some implementations and instances, the two opposite directions along an easy axis are equivalent, and the direction of magnetization can be along either of them. For example, in accordance with some implementations, FIG. 1B shows low energy states 114 and 116 corresponding to opposite directions along an easy axis.

In some implementations, the MTJ structure 100 is an in-plane MTJ. In this instance, the magnetic moments of the reference layer 102 and the storage layer 106, and correspondingly their magnetization direction, are oriented in the plane of the ferromagnetic films of the reference layer 102 and the storage layer 106.

In some implementations, the MTJ structure 100 is a perpendicular (or out-of-plane) MTJ. In this instance, the magnetic moments of the reference layer 102 and the storage layer 106, and correspondingly their magnetization direction, are oriented perpendicular and out-of-plane to the ferromagnetic films of the reference layer 102 and the storage layer 106.

In some implementations, the MTJ structure 100 has preferred directions of magnetization at arbitrary angles with respect to the magnetic films of the reference layer 102 and the storage layer 106.

In accordance with some implementations, an MRAM device provides at least two states such that they can be assigned to digital signals "0" and "1," respectively. One storage principle of an MRAM is based on the energy barrier required to switch the magnetization of a single-domain magnet (e.g., switch the magnetization of the storage layer 106) from one direction to the other.

FIG. 1B shows representative energy barriers of the reference layer 102 and the storage layer 106 of the MTJ 100 in accordance with some implementations. In accordance with some implementations, the energy barrier refers the amount of energy the magnetic material must overcome in order to switch from one magnetization direction to its opposite (e.g., from the state 114 to the state 116). In an MRAM device, the magnetization direction of the reference layer 102 is generally considered fixed, while the magnetization direction of the storage layer 106 is varied to store the "0" and "1" states. Accordingly, the reference layer 102 is composed of materials such that an energy barrier 112 ($E_{B,\,ref}$) of the reference layer 102 is larger than the energy barrier 116 ($E_{B,\,stor}$) of the storage layer 106. In particular, FIG. 1B shows low energy states 114 and 116 for the reference layer 102 separated by the energy barrier 112, and shows low energy states 120 and 122 for the storage layer 106 separated by the energy barrier 118. In some implementations, the storage layer 106 is designed with materials that have a magnetic anisotropy that is high enough to store the magnetization over certain time duration (for e.g., 1 week, 1 month, 1 year, or 10 years).

For an MRAM device with the MTJ structure 100, the resistance states of the MRAM devices are different when the magnetization directions of the reference layer 102 and the storage layer 106 are aligned in a parallel (low resistance state) configuration or in an anti-parallel (high resistance state) configuration, as will be discussed with respect to FIGS. 2A and 2B.

Figure 2A:
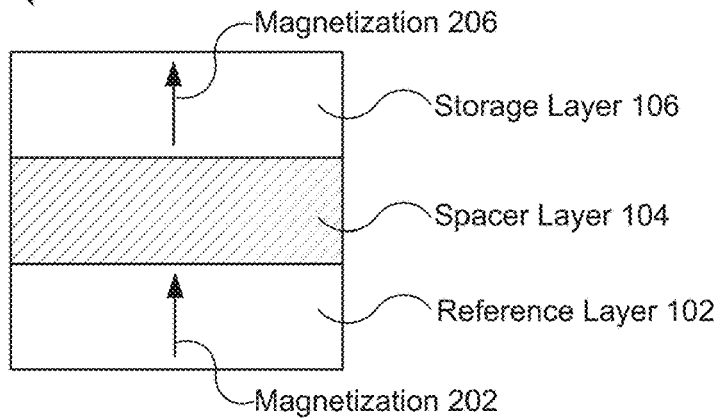
FIGS. 2A-2B illustrate magnetization orientations in a representative perpendicular magnetic tunnel junction (pMTJ) structure in accordance with some implementations.
Figure 2B:
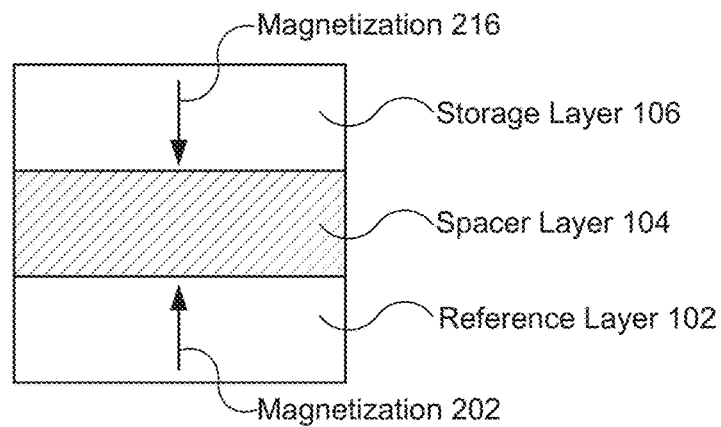

FIGS. 2A-2B illustrate magnetization orientations in a perpendicular magnetic tunnel junction (pMTJ) structure 200 in accordance with some implementations. In some implementations, the pMTJ structure 200 is the same as the MTJ structure 100 presented in FIG. 1A, comprising: the reference layer 102, the spacer layer 104, and the storage layer 106. In some implementations, the pMTJ structure 200 forms part of a MRAM device.

For the pMTJ structure 200 illustrated in FIGS. 2A and 2B, the fixed magnetization direction 202 for the reference layer 102 is chosen to be in an upward direction and is represented by an up arrow. In some implementations (not shown), the fixed magnetization direction of the reference layer 102 in the pMTJ structure 200 is in a downward direction.

FIG. 2A illustrates the magnetization directions of the storage and reference layers in a parallel configuration. In the parallel configuration, the magnetization direction 206 of the storage layer 106 is the same as the magnetization direction 202 of the reference layer 102. In this example, the magnetization direction 202 of the reference layer 102 and the magnetization direction 206 of the storage layer 106 are both in the upward direction. The magnetization direction of the storage layer 106 relative to the fixed layer 102 changes the electrical resistance of the pMTJ structure 200. In accordance with some implementations, the electrical resistance of the pMTJ structure 200 is low when the magnetization direction of the storage layer 106 is the same as the magnetization direction 202 of the reference layer 102. Accordingly, the parallel configuration is also sometimes referred to as a "low (electrical) resistance" state.

FIG. 2B illustrates the magnetization directions of the storage and reference layers in an anti-parallel configuration. In the anti-parallel configuration, the magnetization direction 216 of the storage layer 106 is opposite to the "fixed" magnetization direction 202 of the reference layer 102. In accordance with some implementations, the electrical resistance of the pMTJ structure 200 is high when the magnetization direction 216 of the storage layer 106 is the opposite of the magnetization direction 202 of the reference layer 102. Accordingly, the anti-parallel configuration is sometimes also referred to as a "high (electrical) resistance" state.

Thus, by changing the magnetization direction of the storage layer 106 relative to that of the reference layer 102, the resistance states of the pMTJ structure 200 can be varied between low resistance to high resistance, enabling digital signals corresponding to bits of "0" and "1" to be stored and read. Conventionally, the parallel configuration (low resistance state) corresponds to a bit "0," whereas the anti-parallel configuration (high resistance state) corresponds to a bit "1".

Although FIGS. 2A-2B show parallel and anti-parallel configurations with the pMTJ structure 200, in some implementations, an in-plane MTJ structure, or an MTJ structure with an arbitrary preferred angle, is used instead.

FIGS. 3A-3D illustrate representative processes for switching the pMTJ 200 between the parallel and anti-parallel configurations in accordance with some implementations. In accordance with some implementations, spin-transfer torque (STT) is used to modify the magnetization directions of an MTJ. STT is an effect in which the magnetization direction of a ferromagnetic layer in an MTJ is modified by injecting a spin-polarized current into the magnetic element.

In general, electrons possess a spin, a quantized number of angular momentum intrinsic to the electron. An electrical current is generally unpolarized, e.g., it consists of 50% spin up and 50% spin down electrons. When a current is applied though a magnetic layer, the electrons are polarized with spin orientation corresponding to the magnetization direction of the magnetic layer, thus producing a spin-polarized current (or spin-polarized electrons).

As described earlier, the magnetization direction of the reference layer is "fixed" in an MTJ (e.g., the applied currents are insufficient to change the magnetization state of the reference layer). Therefore, spin-polarized electrons may be used to switch the magnetization direction of the storage layer in the MTJ (e.g., switch between parallel and anti-parallel configurations).

As will be explained in further detail, when spin-polarized electrons travel to the magnetic region of the storage layer in the MTJ, the electrons will transfer a portion of their spin-angular momentum to the storage layer, to produce a torque on the magnetization of the storage layer. When sufficient torque is applied, the magnetization of the storage layer switches, which, in effect, writes either a "1" or a "0" based on whether the storage layer is in the parallel or anti-parallel configuration relative to the reference layer.

Figure 3A:
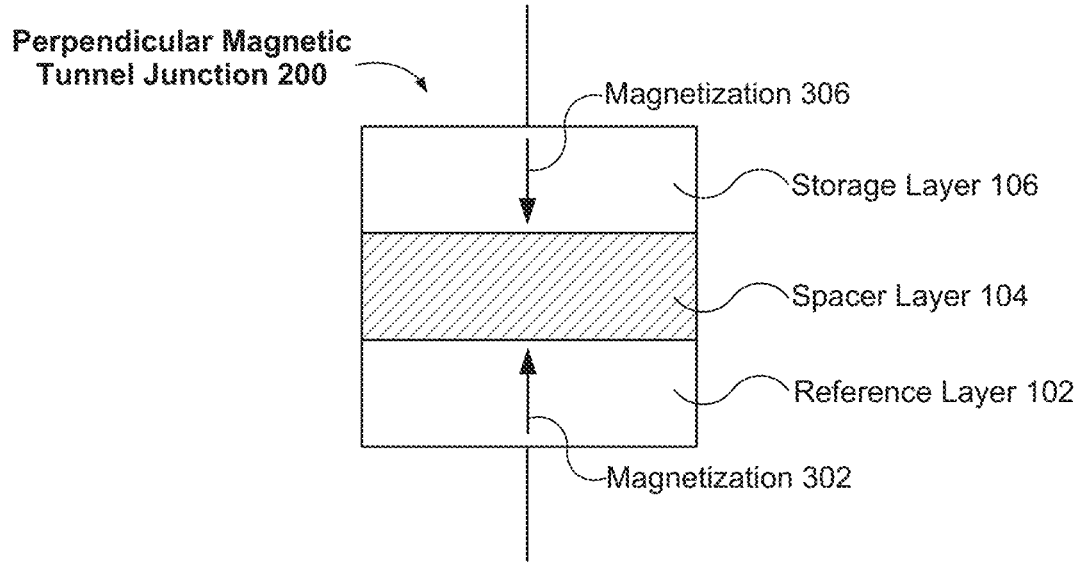
FIGS. 3A-3D illustrate representative processes for switching the pMTJ of FIGS. 2A-2B between the parallel and anti-parallel configurations in accordance with some implementations.
Figure 3B:
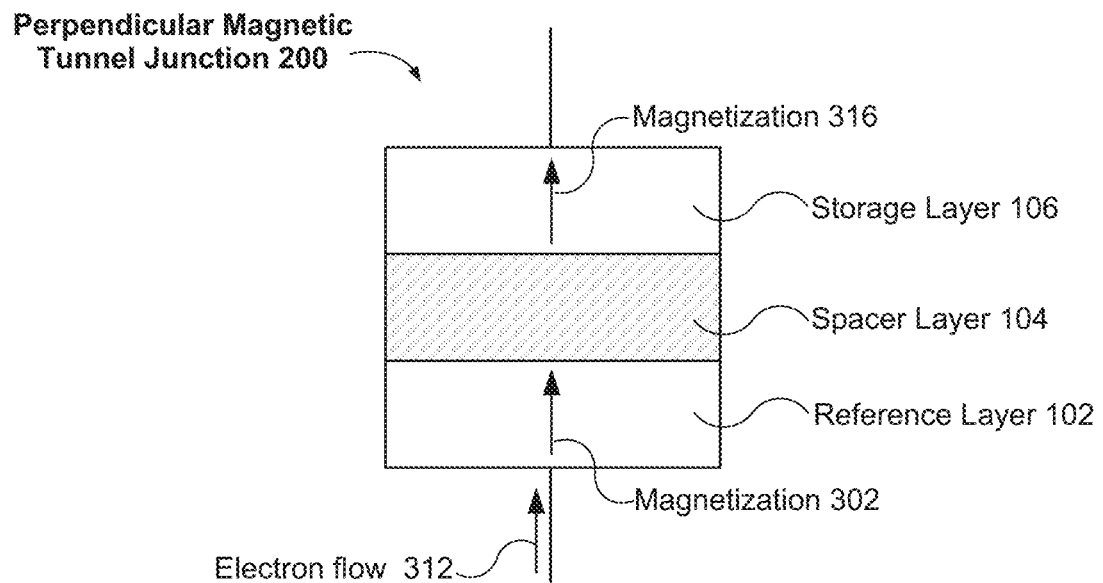

FIGS. 3A-3B illustrate the process of switching from the anti-parallel configuration to the parallel configuration. In FIG. 3A, the pMTJ structure 200 is in the anti-parallel configuration, e.g., the magnetization direction 302 of the reference layer 102 is opposite to the magnetization direction 306 of the storage layer 106.

FIG. 3B shows application of a current such that electrons flow through the pMTJ 200 in accordance with electron flow 312. The electrons are directed through the reference layer 102 which has been magnetized with the magnetization direction 302. As the electrons flow through the reference layer 102, they are polarized (at least in part) by the reference layer 102 and have spin orientation corresponding to the magnetization direction 302 of the reference layer 102. The majority of the spin-polarized electrons tunnel through the spacer layer 104 without losing their polarization and subsequently exert torque on the orientation of magnetization of the storage layer 106. When a sufficiently large current is applied (e.g., a sufficient number of polarized electrons flow into the storage layer 106), the spin torque flips, or switches, the magnetization direction of the storage layer 106 from the magnetization direction 306 in FIG. 3A to the magnetization direction 316 in FIG. 3B.

Thus, as shown in FIG. 3B, the magnetization direction 316 of the storage layer 106 is in the same (upward) direction as the magnetization direction 302 of the reference layer 102. Accordingly, the pMTJ structure 200 in FIG. 3B is in the parallel (low resistance state) configuration. In some implementations and instances, electrons that possess spins in the minority (opposite) direction are reflected at the barrier interfaces and exert torque on the magnetization direction 302 of the reference layer 102. However, the magnetization direction 302 of the reference layer 102 is not switched because the torque, e.g., the amount of electrons, is not sufficient to overcome the damping and hence insufficient to cause switching in the reference layer 102.

Figure 3C:
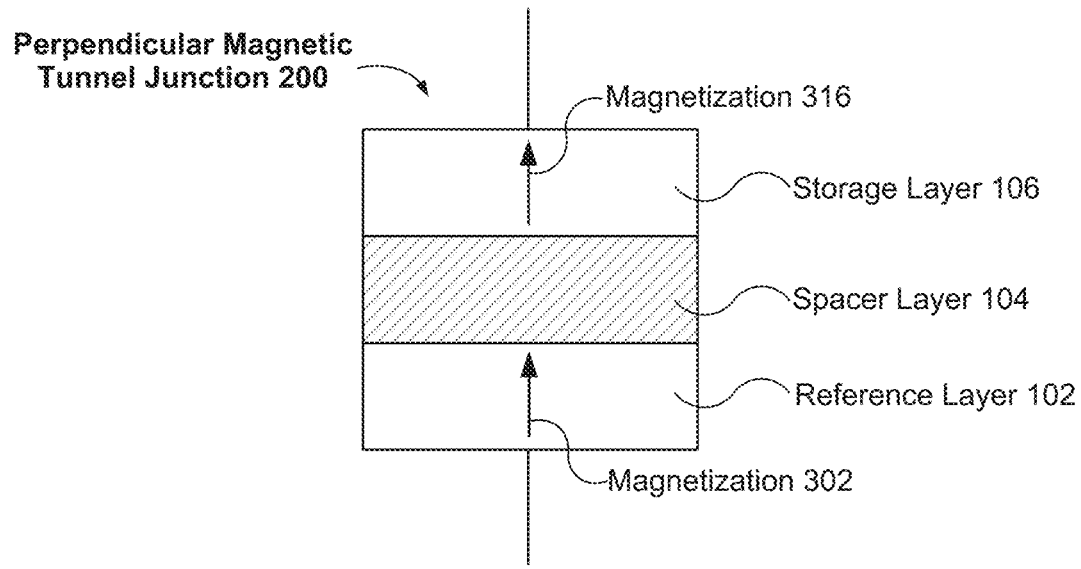
Figure 3D:
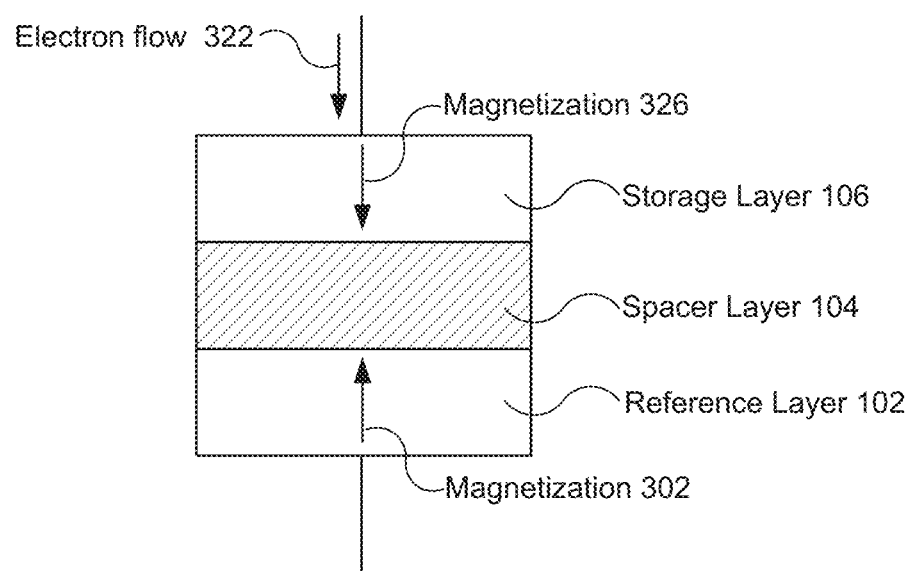

FIGS. 3C-3D illustrate the process of switching from the parallel configuration to the anti-parallel configuration. In FIG. 3C, the pMTJ structure 200 is in the parallel configuration. To initiate switching to the anti-parallel configuration, a current is applied such that electrons flow in accordance with electron flow 322 in FIG. 3D. The electrons flow from the storage layer 106 to the reference layer 102. As the electrons flow through the storage layer 106, they are polarized by the storage layer 106 and have spin orientation corresponding to the magnetization direction 316 of the storage layer 106.

The MTJ structure 200 in FIG. 3C is in the parallel (low resistance state) configuration and thus it has lower electrical resistance, therefore, in some implementations and instances, the majority of the spin-polarized electrons tunnel through the spacer layer 104. Minority spin electrons that are polarized with direction opposite to the magnetization direction 316 of the storage layer 106 are reflected at the barrier interfaces of the spacer layer 104. The reflected spin electrons then exert torque on the magnetization 316 of the storage layer 106, eventually leading to a switch of the magnetization direction 316 of the storage layer 106 in FIG. 3C to a magnetization direction 326 in FIG. 3D. Thus, the pMTJ structure 200 is switched from the parallel (low resistance state) configuration to the anti-parallel (high low resistance state) configuration.

Accordingly, STT allows switching of the magnetization direction of the storage layer 106. MRAM devices employing STT (e.g., STT-MRAM) offer advantages including lower power consumption, faster switching, and better scalability, over conventional MRAM devices that use magnetic field to switch the magnetization directions. STT-MRAM also offers advantages over flash memory in that it provides memory cells with longer life spans (e.g., can be read and written to more times compared to flash memory).

Figure 4:
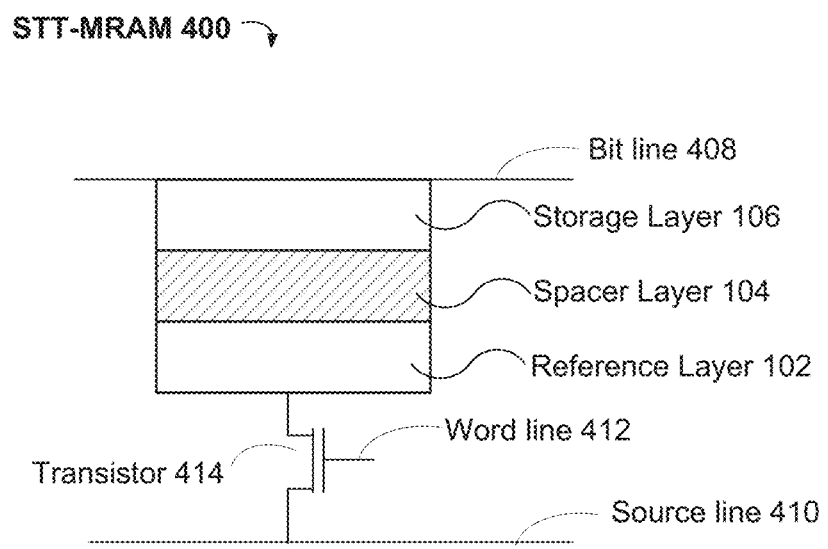
FIG. 4 is a schematic diagram of a representative spin transfer torque (STT) MRAM device in accordance with some implementations.

FIG. 4 is a schematic diagram of a spin transfer torque (STT) MRAM device 400 in accordance with some implementations. The STT-MRAM 400 includes an MTJ device with the reference layer 102, the spacer layer 104, the storage layer 106, and an access transistor 414. The MTJ device is coupled to a bit line 408 and a source line 410 via transistor 414, which is operated by a word line 412. The reference layer 102, the spacer layer 104, and the storage layer 106 compose the MTJ structure 100 and/or the pMTJ structure 200, as described above with reference to FIGS. 1-3. In some implementations, the STT-MRAM 400 includes additional read/write circuitry, one or more additional transistors, one or more sense amplifiers, and/or other components (not shown).

The MTJ structure 100 and/or the pMTJ structure 200 is also sometimes referred to as an MRAM cell. In some implementations, the STT-MRAM 400 contains multiple MRAM cells (e.g., hundreds or thousands of MRAM cells) arranged in an array coupled to respective bit lines and source lines. During a read/write operation, a voltage is applied between the bit line 408 and the source line 404 (e.g., corresponding to a "0" or "1" value), and the word line 412 enables current to flow between the bit line 408 to the source line 410. In a write operation, the current is sufficient to change a magnetization of the storage layer 106 and thus, depending on the direction of electron flow, bits of "0" and "1" are written into the MRAM cell (e.g., as illustrated in FIGS. 3A-3D). In a read operation, the current is insufficient to change the magnetization of the storage layer 106. Instead, a resistance across the MRAM cell is determined. e.g., with a low resistance corresponding to a logical "0" and a high resistance corresponding to a logical "1."

Figure 5A:
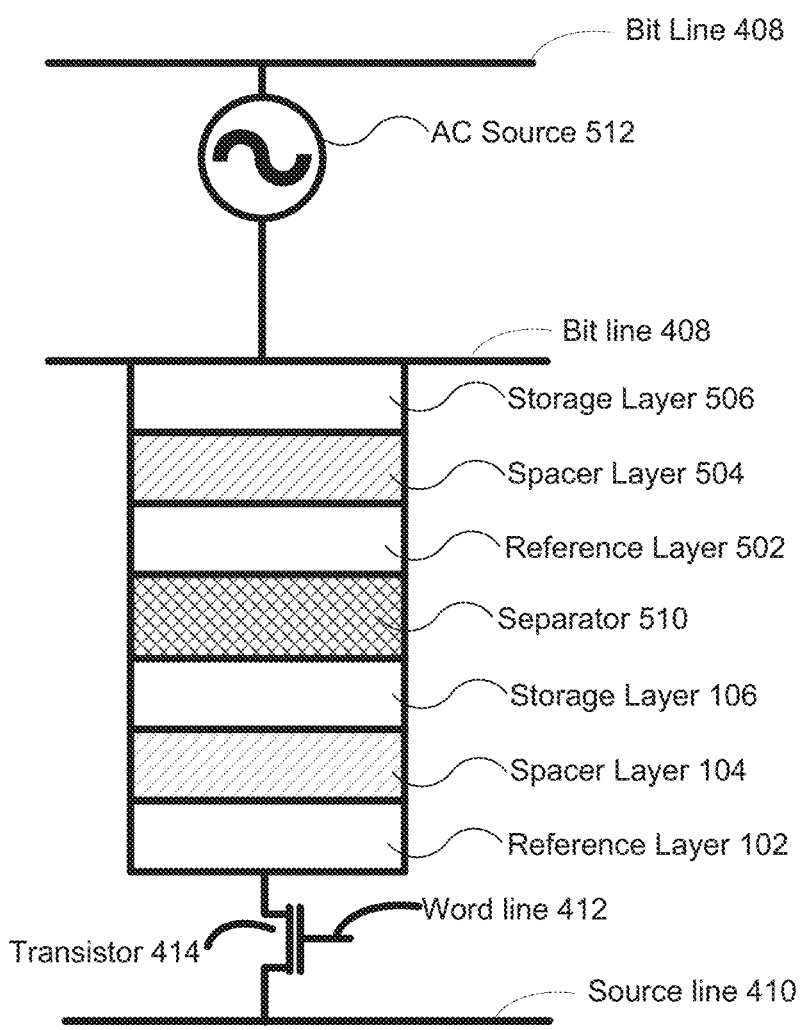
FIGS. 5A-5E are schematic diagrams of representative spin transfer torque (STT) MRAM devices with serially arranged MTJs in accordance with some implementations.

FIG. 5A is a schematic diagram of a spin transfer torque (STT) MRAM device 500 in accordance with some implementations. The STT-MRAM 500 includes two or more MTJ devices, including a first MTJ device (e.g., such as the MTJ structure 100 as shown in FIG. 1) with the reference layer 102, the spacer layer 104, the storage layer 106, and a second MTJ device with a reference layer 502, a spacer layer 504, a storage layer 506. The STT-MRAM 500 also includes a separator 510 (e.g., a metallic separator) that separates the first MTJ device and the second MTJ device. In some implementations, the separator 510 is composed of an electrically-conductive material. In some implementations, the first MTJ device and the second MTJ device are in a stack, but are not aligned with one another (e.g., the second MTJ is horizontally offset from the first MTJ).

The STT-MRAM 500 further includes an access transistor 414 and a bit line 510, such that the first MTJ device and the second MTJ device are arranged (e.g., stacked) in series between the bit line 409 and the transistor 414. In some implementations, the two or more MTJ devices are coupled to the bit line 408 and the source line 410 via the transistor 414, which is operated by the word line 412 as discussed above with respect to FIG. 4. In accordance with some implementations, a grouping of reference layer 102, the spacer layer 104, and the storage layer 106 and a grouping of reference layer 502, spacer layer 504, and storage layer 506 compose two MTJ and/or pMTJ structures as shown and described as MTJ structure 100 and/or the pMTJ structure 200, with reference to FIGS. 1-3. In some implementations, the STT-MRAM 500 includes additional read/write circuitry, one or more additional transistors, one or more sense amplifiers, and/or other components (not shown).

In some implementations, each MTJ includes a magnetic reference layer (e.g., reference layer 102 or reference layer 502) comprised of a ferromagnetic material, and a storage layer that is also comprised of a ferromagnetic material. The reference layer and the storage layer are separated by a tunnel barrier (e.g., spacer layer 104 or spacer layer 504). In some implementations, the tunnel barrier is comprised of MgO.

In some implementations, the storage layer is distinguished from the reference layer is that the latter is made more thermally stable (or harder to switch) by changing its composition, thickness, or the like. In some implementations, a synthetic antiferromagnet configuration is used where two ferrimagnets are separated via a thin layer of Ruthenium (e.g., ~4 angstroms or ~8 angstroms) coupled via magnetostatic and electronic coupling (also sometimes called RKKY coupling). This has an effect of increasing the thermal stability of the reference layer.

Although the MTJs in FIG. 5A are shown with the respective reference layers below the corresponding storage layers, in some implementations, a respective reference layers is positioned above the corresponding storage layer (e.g., the MTJ stack is inverted). In some implementations, the magnetic layers (e.g., reference layer and storage layer) are comprised of thin (e.g., 0.5-10 nm) CoFeB with various compositions, such that the Boron component is between 10 to 40%. In some implementations, the storage layer comprises a thin (e.g., less than 5 nm) CoFeB single layer or a composite layer. For example, in a composite layer, materials can be alternatively arranged to compose the storage layer, such as using Tungsten (symbol "W") or tantalum (symbol "Ta") as insertion layers to change the anisotropy of the MTJ. In some implementations, the storage layer is a thin CoFeB (~<5 nm) single layer or a composite layer comprising, for instance, W or Ta insertion layers in other to further tailor the anisotropy.

In some implementations, the reference layer is composed of a CoFeB layer in contact with the spacer layer (e.g., an MgO spacer layer). In some implementations, the reference layer is itself magnetically coupled (e.g., either in direct contact with or is coupled using a thin (e.g., less than 5 nm or 1 nm) Ta or W spacer) to a synthetic antiferromagnet (e.g., composed of multilayers of Cobalt and Platinum). In some implementations, ferromagnetic layers are themselves antiferromagnetically coupled via a Ruthenium (symbol "Ru") metallic spacer.

In some implementations, the thickness of the layers in the reference layer are adjusted (e.g., tailored) to adjust the stray fields that emanate from each respective layer. This adjustment changes the energetics of the storage layer and has the effect of offsetting the values of the switching currents. Thus, this adjustment can provide an additional method of tailoring the switching currents in the system. In some implementations, the switching current threshold values are tailored to be distinct between the two or more MTJs.

In some implementations, STT-MRAM 500 includes more than two MTJ devices, such as a third MTJ device having a respective reference layer, spacer layer, and storage layer that is coupled to the first and second MTJ devices by a separator. The third MTJ device is optionally arranged (e.g., stacked) in series with the first and second MTJ devices with respect to the transistor 414.

In some implementations, STT-MRAM 500 includes an alternating current (AC) source 512. The AC source 512 is optionally adjustable (e.g., variable) to a frequency that is tuned to a write assist frequency corresponding to the first MTJ device and/or the second MTJ device (e.g., and/or additional MTJ devices included in STT-MRAM 500). In some implementations, the STT-MRAM 500 also includes a direct current (DC) Source. In some implementations, the DC source and the AC source supply current to the MTJ devices. In some implementations, each MTJ has a distinct switching current threshold (sometimes denoted as $I_{c0}$). In accordance with some implementations, the switching current has a DC and an AC component such that the AC is set at the write assist frequency for the MTJ. The switching current threshold is an amount of current required in order to change the magnetic state of a respective MTJ device. In accordance with some implementations, the switching current threshold is dependent on the write assist frequency of the respective MTJ device. In some implementations, the write assist frequency for the MTJ is determined based on internal (e.g., inherent) properties of the storage layer of the MTJ, such as the composition, anisotropy, and thickness of the MTJ. By adjusting the AC source 512 to correspond with the write assist frequency for a particular MTJ, the particular MTJ can be targeted such that the magnetic state of the MTJ is changed without changing the magnetic states of the other MTJs in the memory system. For example, by applying a particular (distinct) switching current threshold, the STT-MRAM 500 is capable of changing the magnetic state of the first respective MTJ device from a parallel to an anti-parallel magnetic state (e.g., or an anti-parallel state to a parallel state) without affecting the magnetic state of the other MTJ devices that are in series with the first respective MTJ device.

Although the operation of the AC source 512 is described in FIG. 5A with regards to operation of multiple MTJs in series, in some implementations, the AC source 512 is coupled to a single MTJ (e.g., as a component of the STT-MRAM 400) or multiple MTJs in other configurations (e.g., in parallel with one another) to assist with the switching process.

Each MTJ device (e.g., the first MTJ device and the second MTJ device) has a respective magnetic characteristic and a respective electrical characteristic. The magnetic characteristics of the MTJ devices are optionally designed to be (e.g., configured to be) substantially distinct from each other. In some implementations, the MTJ devices are designed to give rise to distinct switching current thresholds (e.g., within particular a tolerance level).

In some instances, the magnetic characteristic of an MTJ is based on the anisotropy field of the storage layer, sometimes denoted as $H_k$. In some instances and implementations, the thermal stability of the MTJ device is dependent on $H_k$ and on the size of the MTJ device as well as the thickness of the storage layer. An MTJ device has other magnetic characteristics, including the offset field, sometimes denoted as $H_{offset}$, that is imparted on the storage layer by the reference layer. The magnetic characteristics of the MTJ devices relate to the switching current threshold that is used for writing to the storage layer. The critical switching current threshold of the storage layer is dependent on thermal stability, which relates to both $H_k$ and volume. There is an asymmetry in the switching currents for each MTJ depending on the initial state of the MTJ. For example, the value of the switching currents when the first MTJ is antiparallel and the second MTJ is in parallel is different than the switching current when the first MTJ is in parallel and the second MTJ is in antiparallel. In some implementations, the structure of at least one MTJ is inverted (e.g., with the bottom as reference layer, then spacer layer, and storage layer at the top to having the storage layer at the bottom, followed by the spacer layer and then the reference layer as the top layer).

The electrical characteristics of an MTJ relate to the resistance state, sometimes denoted as $R_{low}$, of the MTJ which is dependent on the thickness of the barrier (e.g., spacer layer 104 or space layer 504) and the lateral size of the MTJ in some instances and implementations.

Figure 5B:
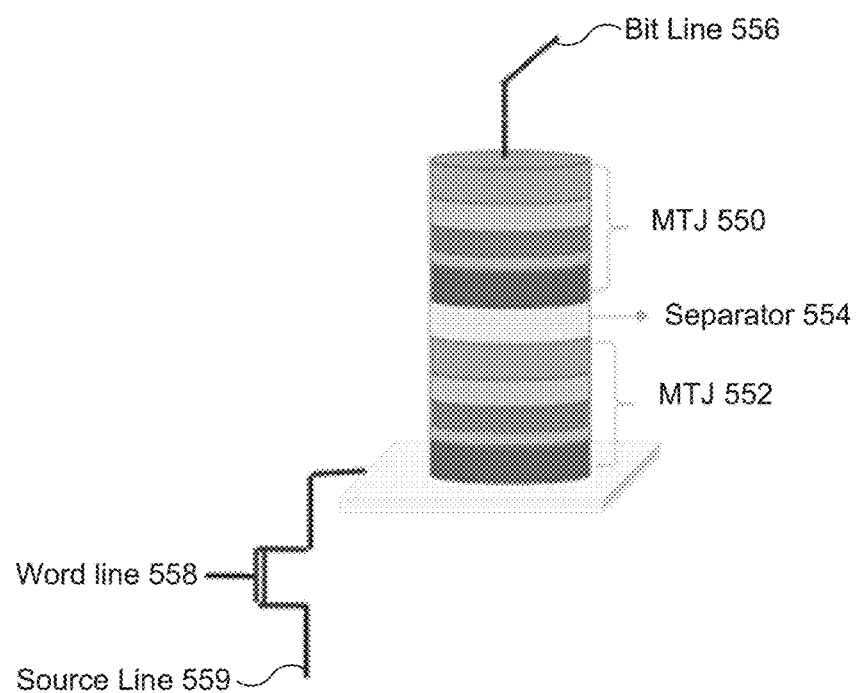
Figure 5C:
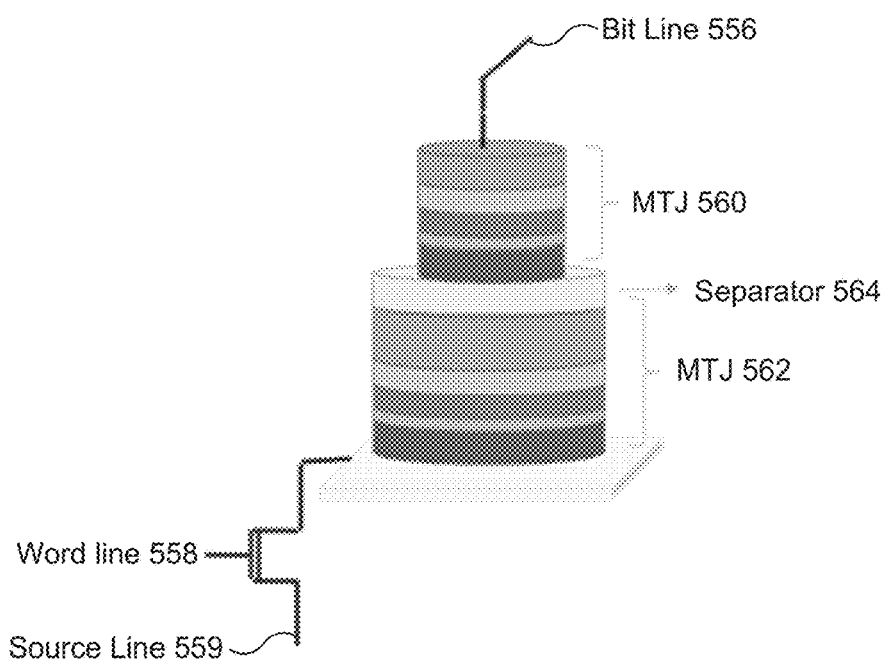

FIGS. 5B-5C illustrate STT-MRAM structures 540 and 545 respectively in accordance with some implementations. The STT-MRAMs 540 and 545 have two MTJs in series between a source line 559 (e.g., via a transistor coupled to a word line 558) and a bit line 556. The STT-MRAM 540 in FIG. 5B includes MTJs 550 and 552 separated by a separator 554 (e.g., a metallic separator). In the example of FIG. 5B, the MTJs 550 and 552 are of cylindrical shape and have a same size (e.g., radius), but have distinct magnetic anisotropies (e.g., due to distinct doping levels). In the example of FIG. 5C, the MTJs 560 and 562 are of cylindrical shape and have distinct sizes (e.g., distinct radii). In some implementations, the MTJs 560 and 562 have distinct magnetic anisotropies (e.g., due to distinct doping levels).

Figure 5D:
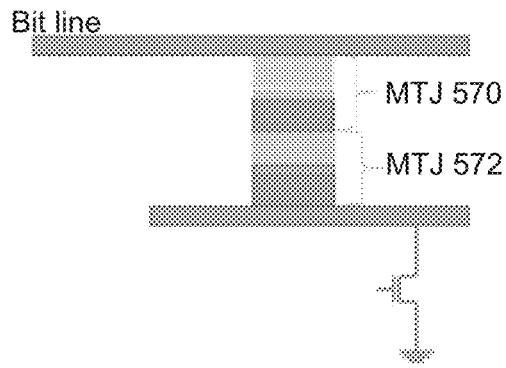
Figure 5E:
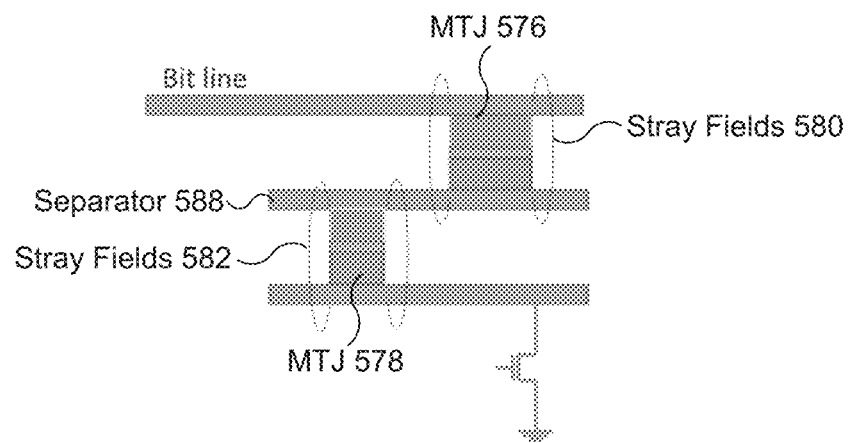

FIGS. 5D-5E illustrate STT-MRAM structures 569 and 575 respectively in accordance with some implementations. The STT-MRAMs 569 and 575 have two MTJs in series between a transistor and a bit line. In the example of FIG. 5D, the MTJ 570 has a distinct resistance times area (RA) product from the MTJ 572. For example, the MTJ 570 has a thinner spacer layer resulting in a lower RA produce and a lower resistance, and a higher $H_k$ resulting in a higher $I_{c0}$. In this example, the MTJ 572 has a thicker spacer layer resulting in a higher RA product and higher resistance, and a lower $H_k$ resulting in a lower $I_{c0}$.

FIG. 5E shows two MTJs coupled in series with a separator 588 (e.g., a metallic separator) in between. In the example of FIG. 5E, the MTJ 576 is laterally offset from the MTJ 578 so as to minimize the effects of stray fields 582 on the MTJ 576 and the effects of the stray fields 580 on the MTJ 578.

Figure 6A:
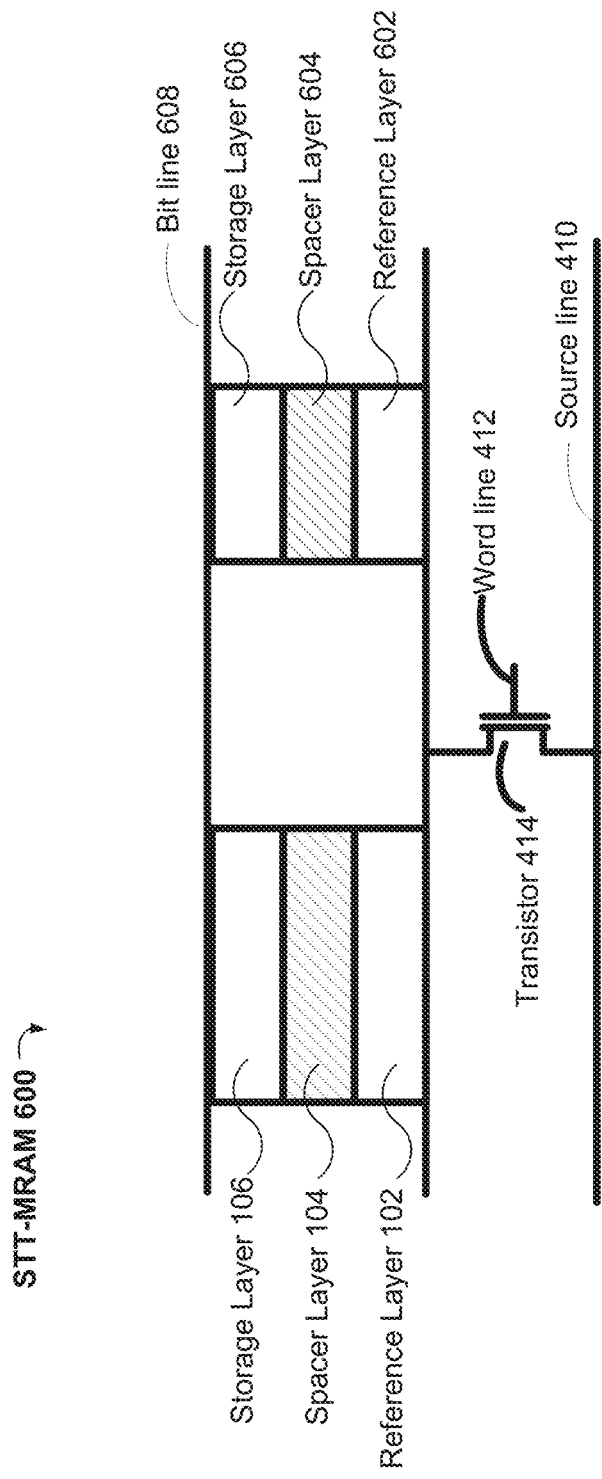
FIGS. 6A-6B are schematic diagrams of representative spin transfer torque (STT) MRAM devices with MTJs arranged in parallel in accordance with some implementations.

FIG. 6A is a schematic diagram of a spin transfer torque (STT) MRAM device 600 in accordance with some implementations. The STT-MRAM 600 includes two or more MTJ devices, including a first MTJ device (e.g., such as the MTJ structure 100 as shown in FIG. 1) with the reference layer 102, the spacer layer 104, the storage layer 106, and a second MTJ device with reference layer 602, spacer layer 604 and storage layer 606. STT-MRAM 600 further includes an access transistor 414, such that the first MTJ device and the second MTJ device are arranged in parallel with respect to the transistor. The two or more MTJ devices are coupled to and share a bit line 608 and a source line 410 via transistor 414, which is operated by a word line 412. The grouping of reference layer 102, the spacer layer 104, and the storage layer 106 and the grouping of reference layer 602, spacer layer 604, and storage layer 606 compose two MTJ and/or pMTJ structures as shown and described as MTJ structure 100 and/or the pMTJ structure 200, with reference to FIGS. 1-3. In some implementations, the STT-MRAM 600 includes additional read/write circuitry, one or more additional transistors, one or more sense amplifiers, and/or other components (not shown). In some implementations, the STT-MRAM 600 includes an AC source (e.g., the AC source 512).

In accordance with some implementations, the two or more MTJs are distinct devices. In some implementations, each MTJ is configured independently from the other MTJs (e.g., is sized, doped, etc. independently). In some implementations, at least a subset of the two or more MTJs are arranged in distinct configurations. For example, a first MTJ is arranged with its reference layer on the bottom and its storage layer on the top while a second MTJ is arranged with its storage layer on the bottom and its reference layer on the top. In some implementations, the two or more MTJs are designed (e.g., configured) to have different sizes (e.g., diameters, width, thickness) in order to achieve different thermal stability in each MTJ device. This allows the MTJs to have different switching current threshold values for a given voltage pulse width. In some implementations, the distinct switching current thresholds are achieved by changing the magnetic anisotropy of the storage layer (e.g., storage layer 106 and storage layer 606). For example, changing the composition of materials and/or the thickness of the storage layer will also change the switching current thresholds. Thus, by making the two MTJs have different sizes and/or magnetic anisotropies, the two MTJs will have different switching current threshold values in order to selectively write bits to the memory device.

In some implementations, standard MRAM fabrication techniques are used to create the MTJs. As the two or more MTJs share a bottom electrode in parallel configuration, discrete total resistance values are achieved based on the different magnetic configurations of each of the MTJs. These discrete total resistance values are illustrated in FIG. 7B.

By placing two or more MTJs in a single memory cell, the cell size footprint of the STT-MRAM 600 is reduced (e.g., the density of an MRAM array is increased) as several STT-MTJs use a common transistor thus reducing the cell size per bit).

Figure 6B:
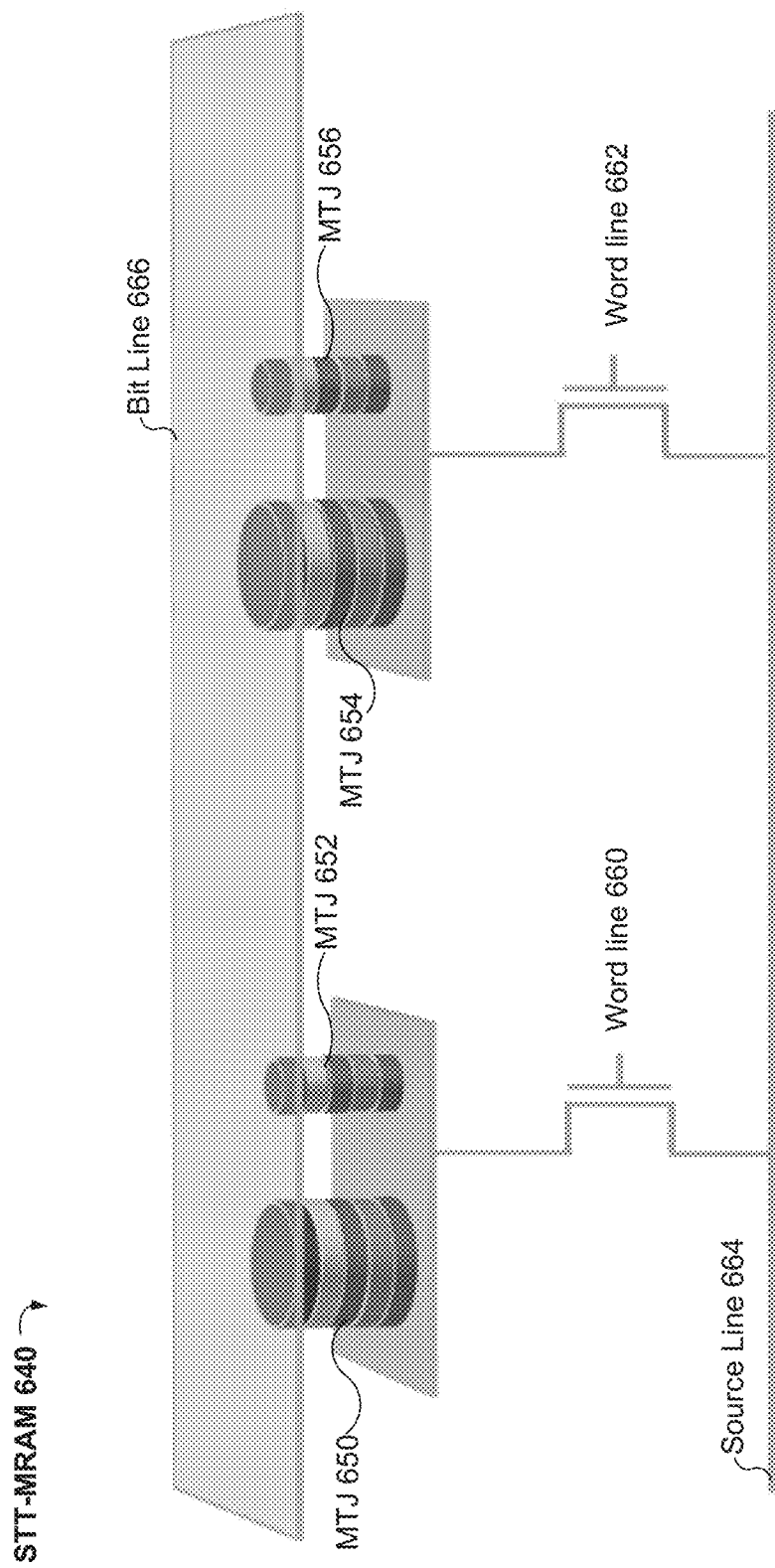

FIG. 6B illustrates a STT-MRAM structure 640 in accordance with some implementations. The STT-MRAM 640 in FIG. 6B includes a first cell having two MTJs 650 and 652 in parallel between a source line 664 (e.g., via a transistor coupled to a word line 660) and a bit line 666. The STT-MRAM 640 also includes a second cell having two MTJs 654 and 656 in parallel between a source line 664 (e.g., via a transistor coupled to a word line 662) and a bit line 666.

In the example of FIG. 6B, the MTJs 650, 652, 654, and 656 are of cylindrical shape. In some implementations, one or more of the MTJs have a distinct shape (e.g., an elliptical shape). The MTJs 650 and 652 are shown with distinct sizes (e.g., distinct radii), however, in accordance with some implementations the MTJs 650 and 652 have a same sizing, but distinct magnetic anisotropies (e.g., due to being composed of distinct materials).

Figure 7A:
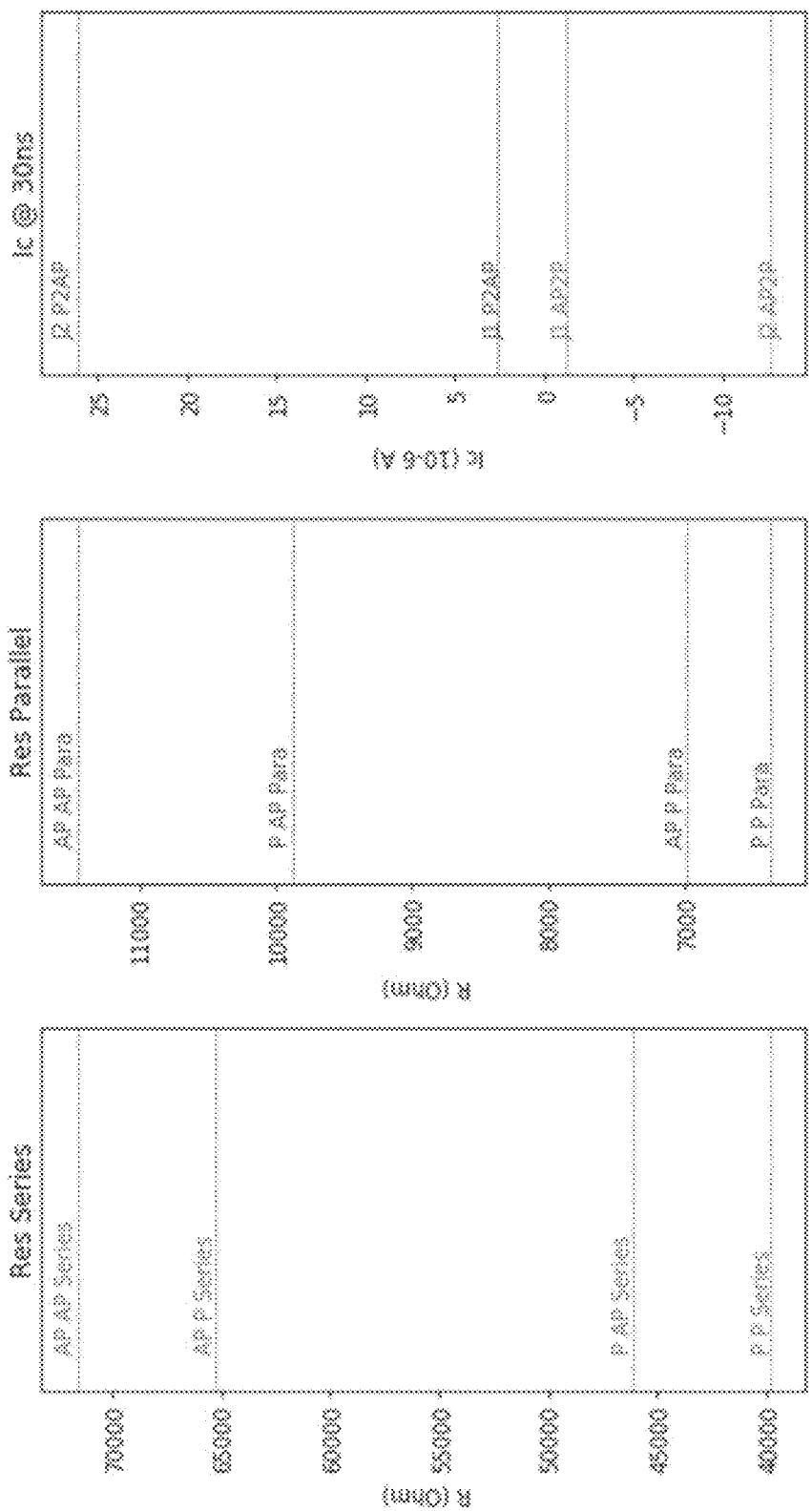
FIGS. 7A-7D are graphical representations of varying resistive values and threshold currents for an MRAM device based on magnetic states in accordance with some implementations.
Figure 7B:
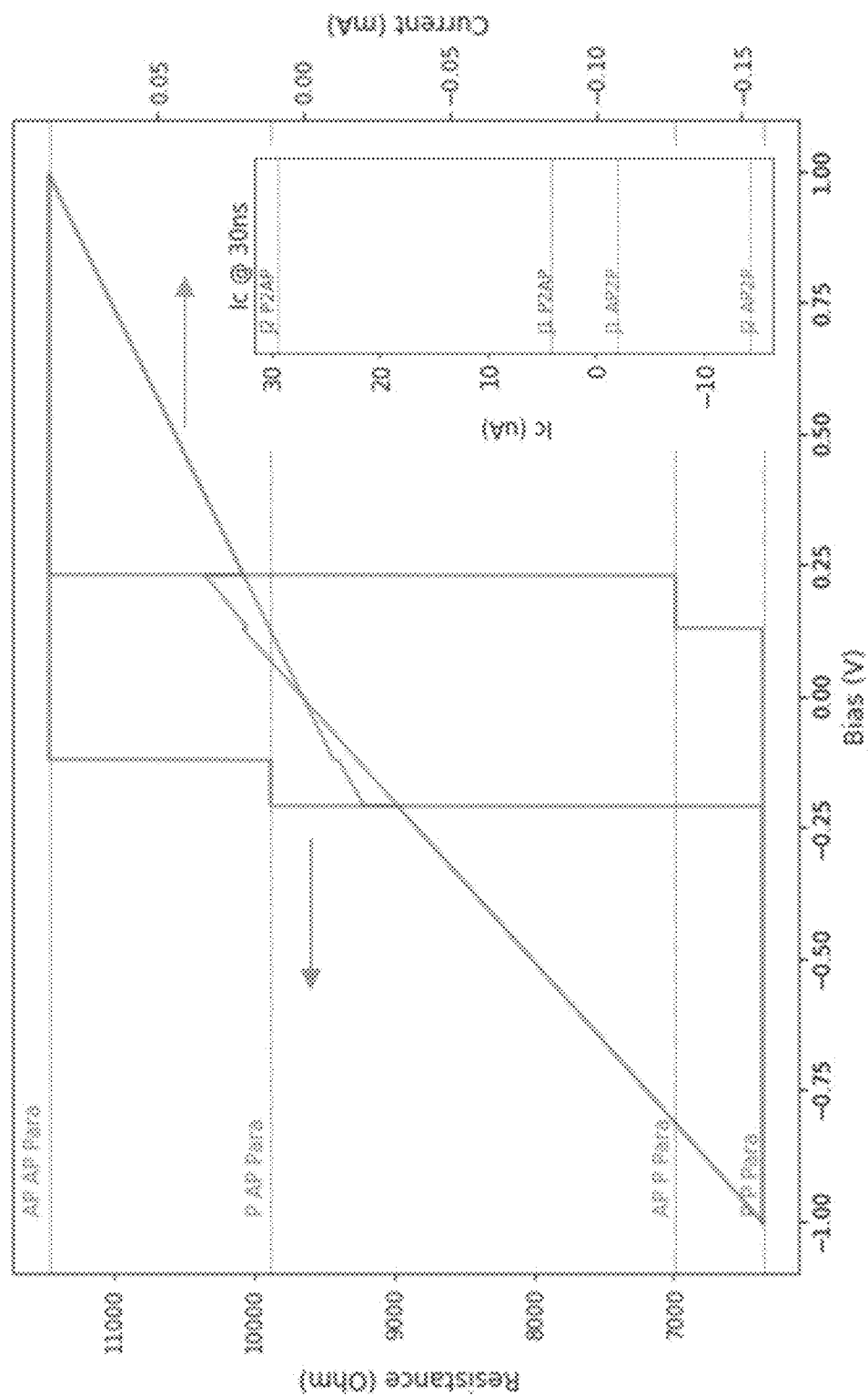

FIG. 7A is a graphical representation of example resistive values and current thresholds for two MTJs coupled in series and parallel configurations in accordance with some implementations. Graph (i) in FIG. 7A shows example resistive values for two MTJs in a series configuration. As shown in graph (i), when both MTJs are in a "P" state a lowest resistance (e.g., ~40 kOhms) is measured across the MTJs. When one of the MTJs is in an "AP" state, a second lowest resistance (e.g., ~46 kOhms) is measured. When the other MTJ is in the "AP" state, a third lowest resistance (second highest resistance) (e.g., ~65 kOhms) is measured. When both MTJs are in the "AP" state the highest resistance (e.g., ~72 kOhms) is measured across the MTJs. Thus, based on the measured resistance across the MTJs, the state of each MTJ can be determined.

Graph (ii) in FIG. 7A shows example resistive values for two MTJs in a parallel configuration. As shown in graph (ii), when both MTJs are in a "P" state a lowest resistance (e.g., ~6.2 kOhms) is measured across the MTJs. When one of the MTJs is in an "AP" state, a second lowest resistance (e.g., ~7 kOhms) is measured. When the other MTJ is in the "AP" state, a third lowest resistance (second highest resistance) (e.g., ~10 kOhms) is measured. When both MTJs are in the "AP" state the highest resistance (e.g., ~11.8 kOhms) is measured across the MTJs. Thus, as with the series configuration, based on the measured resistance across the MTJs, the state of each MTJ can be determined.

Graph (iii) in FIG. 7A shows example current thresholds for MTJs in a parallel configuration. As shown in graph (iii), the current required to switch a first MTJ from an "AP" state to a "P" state is around 12 microamps, and the current required to switch a second MTJ from an "AP" state to a "P" state is around 1 microamp. As also shown in graph (iii), the current required to switch the first MTJ from an "P" state to a "AP" state is around 26 microamps, and the current required to switch the second MTJ from an "P" state to a "AP" state is around 3 microamps. In the example of graph (iii) the sign of the current corresponds to a directionality of the current (e.g., current is supplied in a first direction through the MTJs to switch from "AP" to "P" and is supplied in a second direction through the MTJs to switch from "P" to "AP").

FIG. 7B is a graphical representation of the changing resistive values measured across two MTJs arranged in parallel (e.g., shown in STT-MRAM 600) in response to applying a changing voltage (e.g., bias) in accordance with some implementations. In the example of FIG. 7B, if the two MTJs are initially in the "AP AP" state, a bias voltage of around −0.20 volts switches the MTJs to the "P AP" state and a bias voltage of around −0.25 volts switches the MTJs to the "P P" state. In this example, if the MTJs are in the "P P" state, a bias voltage of around 0.15 switches the MTJs to the "AP P" state and a bias voltage of around 0.25 sets the MTJs to the "AP AP" state.

As discussed previously, each MTJ in the memory cell (e.g., the memory cell shown in FIG. 6) can be designed to have a different MTJ resistance, and different current switching thresholds, which creates discrete total resistance values that are dependent on the magnetic states of each MTJ (e.g., whether the MTJ is in parallel or antiparallel). As shown in FIG. 7B, the calculated current-voltage and resistance-voltage characteristics using a given pulse (e.g., 20 ns, 30 ns, or 60 ns) allows for discrete resistance values of total resistance measured across the memory cell. Here, using two MTJs within one memory cell results in four discrete resistance values, which corresponds to 4 possible values to be stored as bits in the memory cell (e.g., "00", "01", "10", and "11" respectively corresponding to the following states for the two MTJ's: "P P", "P AP", "AP P", and "AP AP").

Figure 7C:
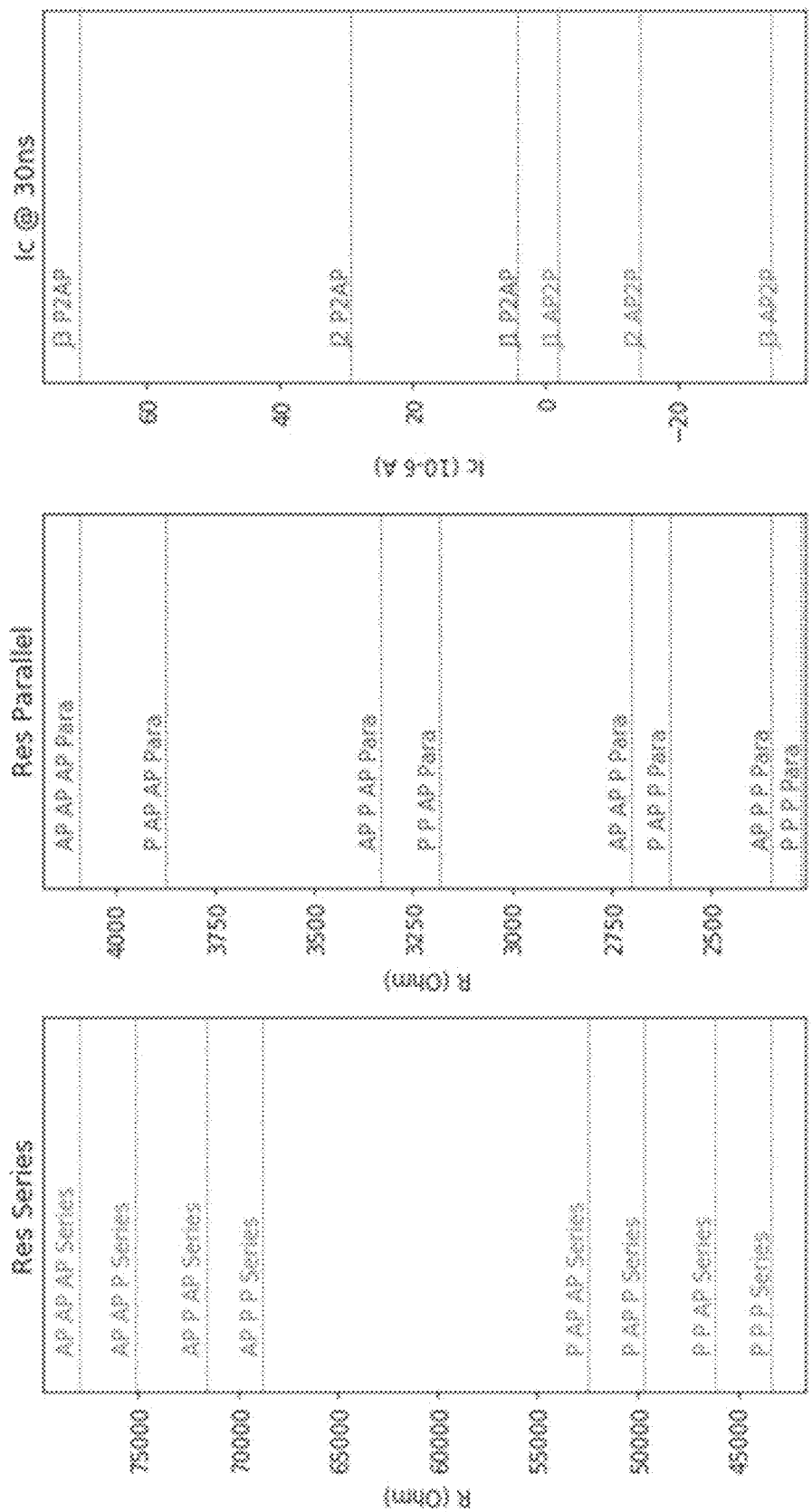
Figure 7D:
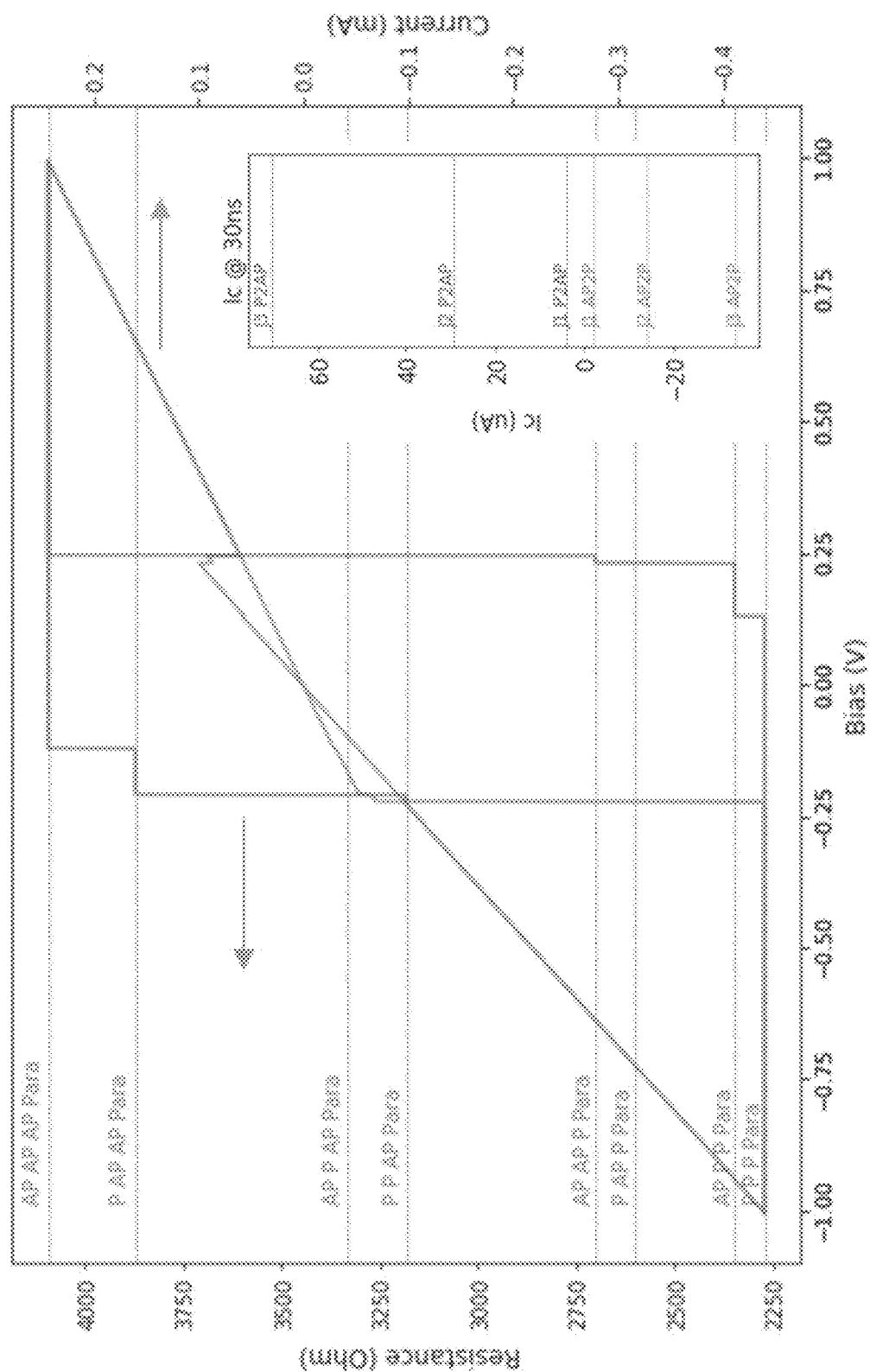

FIG. 7C is a graphical representation of example resistive values and current thresholds for three MTJs coupled in series and parallel configurations in accordance with some implementations. FIG. 7D is a graphical representation of the changing resistive values measured across three MTJs arranged in parallel in response to applying a changing voltage (e.g., bias) in accordance with some implementations. FIGS. 7C and 7D are similar to FIGS. 7A and 7B except that they illustrate a three MTJ configuration rather than a two MTJ configuration.

In light of these principles, we now turn to certain implementations.

In some implementations, a memory cell apparatus is provided (e.g., the STT-MRAM 500, FIG. 5A). The apparatus comprises two or more magnetic tunnel junctions (MTJs), such as the two or more MTJs shown in FIG. 5A, including a first MTJ having a first magnetic characteristic and a first electrical characteristic and a second MTJ having a second magnetic characteristic and a second electrical characteristic, where the first magnetic characteristic is distinct from the second magnetic characteristic.

The apparatus further comprises a transistor (e.g., the transistor 414, FIG. 5A) having three terminals such that the first MTJ is coupled to a first terminal of the three terminals, and a metallic separator (e.g., metallic separator 510) that couples the first MTJ with the second MTJ, where the first MTJ and the second MTJ are arranged in series within a single memory cell (e.g., the memory cell accessed by the source line 410, the word line 412, and the bit line 408, FIG. 5A).

In some implementations, each MTJ is configured to have a perpendicular (out-of-plane) magnetization direction. In accordance with some implementations, the activation energy or anisotropy for each MTJ is not based on the shape of the respective MTJ, unlike in-plane magnetization devices. One advantage of using perpendicular devices instead of in-plane devices is that the efficiency of the switching process as measured by the quotient $\Delta/I_{c0}$ is higher in perpendicular devices, where "$\Delta$" refers to the thermal energy barrier and "$I_{c0}$" refers to the switching threshold current. However, there are challenges with fabricating and positioning perpendicular devices that are not present in the fabrication and positioning of in-plane devices.

In some implementations, each MTJ has distinct switching current thresholds (e.g., as illustrated in FIG. 7A). In some implementations, different values of resistance and threshold currents (e.g., as illustrated in FIG. 7A) are achieved by varying the respective size of the MTJs, since the thermal stability and $I_{c0}$ are proportional to the area of the device.

Etching two MTJs stacked on top of one another at the same time with a relatively thick stack (e.g., >70 nm) is difficult to do without redepositing metals on the sidewalls and shorting the whole structure. In addition, a thick stack limits the achievable density, e.g., due to ion beam etching shadowing.

Also, etching two MTJs with different sizes on top of one another (e.g., aligned with one another) is challenging, particularly at small process sizes (e.g., <60 nm). In some implementations, the two MTJs are deposited concurrently and are essentially the same size, e.g., as illustrated in FIG. 5D. In some implementations, depositing the two MTJs requires only one photolithographic step. In some implementations, the resistances of each MTJ are adapted to be different by adjusting the resistance area (RA) product of the first MTJ (e.g., a spacer layer of the first MTJ) with respect to the second MTJ (e.g., a spacer layer of the second MTJ). In some implementations, the thickness of one or more of the spacer layers is adjusted to achieve a desired RA product, e.g., since the RA product depends exponentially on barrier (spacer layer) thickness.

In some implementations, the switching currents are adapted to be different between the MTJs. In some implementations, the switching currents are adapted by adjusting the perpendicular anisotropy field ($H_k$) of each device. For example, by adjusting the thickness of each free (storage) layer within the range of 6 Angstrom to 16 Angstrom. In some instances, the higher the $H_k$, the higher the $I_{c0}$. In some implementations, the switching currents are adapted by adjusting the composition of the MTJs. For example, by changing the boron concentration in an MTJ composed of CoFeB. In accordance with some implementations, adjusting the composition of the MTJs adapts the switching currents by adjusting the moment of each storage layer in order to change. For example, in some instances, a smaller moment equates to higher perpendicular thermal stability because the demagnetization contribution is less. In addition, adjusting the composition has the additional effect of changing the damping factor for the MTJ, which causes a variation of $I_{c0}$.

In some implementations, the two MTJs are produced with different sizes. In some implementations, the two MTJs are arranged in an offset position from the one another so as to minimize influence of stray fields between the MTJs (e.g., instead of performing a stack deposition process in one shot). In some implementations, the first MTJ is deposited then a lateral patterning process is performed (e.g., including lithography, ion beam etching, encapsulation, polishing to open up the top of the MTJ for contacts, then depositing and patterning of a top electrode). In some implementations, after the lateral patterning process, a separator layer (also sometimes called a "strap") is deposited. In some implementations, after depositing the separator layer, the deposition and patterning process is repeated for the second MTJ. This approach simplifies the fabrication process as compared to conventional approaches as the etching steps are not subject to the same density limitations as etching the two MTJs in one shot. This approach also enables the MTJs to be positioned offset laterally from one another (e.g., to minimize stray fields between MTJs) in accordance with some implementations.

In some implementations, the reference layer of each MTJ has substantial stray field contribution (e.g., due to the relatively large thickness of the reference layer) even at distances of the order of several tens of nanometers. For a given MTJ, the stray field from the reference layer onto the storage layer can be difficult to optimize without compromising the reference layer's perpendicular-magnetic anisotropy. Moreover, when two MTJs are in proximity with one another (e.g., aligned on top of one another), the stray fields from the reference layer of one of the MTJs can affect the storage layer of the other MTJ. In some implementations, the stray field effects between MTJs is minimized by laterally offsetting the MTJs, e.g., as shown in FIG. 5E. Offsetting the MTJs laterally enables the stray field of each MTJ to be optimized independently in accordance with some implementations.

In some implementations, the first magnetic characteristic is based on a first magnetic anisotropy and a first offset field on a first storage layer of the first MTJ and the second magnetic characteristic is based on a second magnetic anisotropy and a second offset field on a second storage layer of the second MTJ.

In some implementations, a respective magnetic characteristic is an anisotropy field, sometimes denoted as $H_k$, of the storage layer of the respective MTJ. In some implementations, the thermal stability of a respective MTJ depends on $H_k$ and on the size of the MTJ. In some implementations, the respective magnetic characteristic is the offset field ($H_{offset}$) imparted on the storage layer of the MTJ by the reference layer of the MTJ.

In some implementations, a respective electrical characteristic is the $I_{c0}$ or the switching current threshold of the storage layer. In some implementations, the switching current threshold is dependent on thermal stability. In some implementations, a respective electrical characteristic is the resistance state $R_{low}$ of the MTJ. In some implementations, $R_{low}$ is dependent on the thickness of the spacer layer and/or the lateral size of the MTJ.

In some implementations, each respective MTJ has a respective magnetic characteristic determined by one or more material compositions of the MTJs. In some implementations, the material compositions include materials selected from the group consisting of: MgO, CoFeB, Cobalt, Platinum, Ruthenium, Tungsten, and Tantalum.

In some implementations, the first electrical characteristic of the first MTJ is a first resistance determined based on a geometric property of the first MTJ and an RA product (e.g., Resistance×Area) of the first MTJ and the second electrical characteristic of the second MTJ is a second resistance determined based on a geometric property of the second MTJ and an RA product of the second MTJ. In some implementations, the first electrical characteristic is distinct from the second electrical characteristic. In some implementations, the first electrical characteristic has the same value as the second electrical characteristic. In some implementations, the geometric property of each MTJ is selected from the group consisting of area, diameter, width and thickness. In some implementations, changing the thickness of the storage layer (e.g., storage layer 104 and/or storage layer 506) changes a switching characteristic (e.g., a thermal stability corresponding to a switching current) of the MTJ. In some implementations, the switching characteristic is proportional to the volume of the MTJ. For example, two MTJs that share the same size (e.g., the same diameter or width) and have different storage layer thicknesses will also have different switching currents. The two MTJs may also share the same baseline resistance (e.g., the same resistance measured across the MTJs that is inherent to the materials used to construct the MTJs), but have different thicknesses of their spacer layers (e.g., different barrier thicknesses) and thus the RA product would be different between the two MTJs. width.

In some implementations, the geometric property of each MTJ is based on an order of stacking a reference layer, a spacer layer, and a storage layer of each MTJ. For example, storage layer 506 is depicted on top of spacer layer 504 and reference layer 502. The stacking order may be inverted such that reference layer 502 is on top of spacer layer 504 and storage layer 506.

In some implementations, each respective MTJ has a distinct switching current value that is determined by the magnetic characteristic of the respective MTJ.

In some implementations, the apparatus further comprises a third MTJ having a third magnetic characteristic and a third electrical characteristic. The third magnetic characteristic is distinct from the first magnetic characteristic and the second magnetic characteristic. The apparatus further comprises a second metallic separator that couples the third MTJ with the second MTJ, such that the first MTJ, the second MTJ, and the third MTJ are arranged in series.

In some implementations, a total resistance measured across the two or more MTJs have $2^n$ discrete values, where n is a number of MTJs. In some implementations, the discrete values of total resistance measured across the two or more MTJs correspond to bits stored by the MTJs (e.g., "00", "01", "10", and "11" for two MTJs).

In some implementations, the two or more MTJs store a fewer number of bits than the total number of discrete resistance values, where n is a number of MTJs of the two or more MTJs. In some implementations, the two or more MTJs have a maximum of $2^n$ bits stored, where n is a number of MTJs.

In some implementations, the apparatus is responsive to a single or multi-level voltage pulse for writing one or more bits to the two or more MTJs, wherein writing the one or more bits changes a magnetic state of the first MTJ and/or a magnetic state of the second MTJ. For example, in response to a voltage pulse, the first MTJ may change a magnetic state from Parallel to Anti-parallel, or from Anti-parallel to parallel. The first MTJ will switch magnetic states in accordance with a determination (e.g., in response to) applying a voltage that satisfies the critical switching current for the first MTJ.

In some implementations, the magnetic state of the MTJ is a parallel magnetic state or an anti-parallel magnetic state. For example, a perpendicular MTJ can have two magnetic states, parallel and antiparallel, either of which can be the first magnetic state. An MTJ in parallel magnetic state have reference layer and storage layer magnetization directing in the same direction. An MTJ in antiparallel magnetic state have reference layer and storage layer magnetization directing in the opposite direction.

In some implementations, the apparatus is responsive to instructions for reading a resistance across the two or more MTJs to determine one or more bits that are stored in each MTJ of the two or more MTJs. For example, by reading the resistance across the two or more MTJs, the bit (e.g., which may have 2^n possible values) that is stored by the two or more MTJs may be determined.

In some implementations, the first MTJ is in a first magnetic state and the second MTJ is in the first magnetic state, which creates a first resistance measured across the first MTJ and the second MTJ. For example, the first MTJ and second MTJ are in the "P" state (corresponding to "00").

In some implementations, the first MTJ is in a second magnetic state and the second MTJ is in the first magnetic state, creating a second resistance, measured across the first MTJ and the second MTJ, distinct from the first resistance. For example, the first MTJ is in the "AP" state and second MTJ is in the "P" state (corresponding to "10").

In some implementations, the first MTJ is in the first magnetic state and the second MTJ is in the second magnetic state, creating a third resistance, measured across the first MTJ and the second MTJ, distinct from the fourth resistance and the fifth resistance. For example, the first MTJ is in the "P" state and second MTJ is in the "AP" state (corresponding to "01").

In some implementations, the first MTJ is in the second magnetic state and the second MTJ is in the second magnetic state, creating a fourth resistance, measured across the first MTJ and the second MTJ, distinct from the fourth resistance, the fifth resistance, and the sixth resistance. For example, the first MTJ and second MTJ are in the "AP" state (corresponding to "11").

In some implementations, a total resistance measured across the first MTJ and the second MTJ (e.g., across the memory cell) is discrete based on a magnetic state of the first MTJ and the magnetic state of the second MTJ.

In some implementations, the two or more MTJs include a third MTJ arranged in series with the first MTJ and the second MTJ.

In some implementations, the respective reference layer of one or more of the MTJs includes multiple sub-layers. In some implementations, the thicknesses of the sub-layers are adapted to adjust the stray fields that emanate from that layer. The adjustment of the stray fields changes the energetics of the respective storage layer and has the effect of offsetting the values of the switching currents.

In some implementations, a method is provided for writing to the STT-MRAM 500. The method comprises, in a memory device (e.g., STT-MRAM 500) that includes two or more magnetic tunnel junctions (MTJs) arranged in series with respect to a single terminal of a transistor. The two or more MTJs include a first MTJ having a first magnetic characteristic and first electrical characteristic and a second MTJ having a second magnetic characteristic that is distinct from the first magnetic characteristic and a second electrical characteristic. The method includes writing an MTJ (e.g., the first MTJ), including applying a DC current to the two or more MTJs and applying an AC current to the two or more MTJs. The AC current is adjusted to a frequency that is tuned to a write assist frequency corresponding to the respective MTJ. In some implementations, in response to applying the DC and the AC current adjusted to the write assist frequency of the first MTJ, the first MTJ is written without writing the second MTJ. In some implementations, in response to applying the DC and the AC current adjusted to the write assist frequency of the second MTJ, the second MTJ is written without writing the first MTJ.

In some implementations, the two or more MTJs are perpendicular MTJs (pMTJs). A perpendicular MTJ comprises a magnetic reference layer in a first plane, the magnetic reference layer having a magnetization vector that is perpendicular to the first plane and having a fixed magnetization direction, a non-magnetic spacer layer in a second plane and disposed over the magnetic reference layer and a magnetic storage layer in a third plane and disposed over the non-magnetic spacer layer. The magnetic storage layer has a magnetization vector that is perpendicular to the third plane and having a magnetization direction that is same as the reference layer or that is in the opposite direction of the reference layer.

In some implementations, the write assist frequency for the respective MTJ is near (e.g., within 10%, 20%, or 30%) of a natural precession frequency of a storage layer of the respective MTJ determined while the free layer is in an equilibrium position.

In some implementations, the first MTJ has a first magnetic anisotropy and the second MTJ has a second magnetic anisotropy distinct from the first magnetic anisotropy. The first magnetic characteristic is based on the first magnetic anisotropy and the second magnetic characteristic is based on the second magnetic anisotropy.

In some implementations, the first MTJ has a first size and the second MTJ has a second size and the first MTJ has a first RA product and the second MTJ has a second RA product. In some implementations, the first electrical characteristic is based on the first RA product and the first size of the first MTJ and the second electrical characteristic is based on the second RA product and the second size of the second MTJ. In some implementations, the first electrical characteristic is distinct from the second electrical characteristic. In some implementations, the first electrical characteristic corresponds to a baseline resistance that is the same as a baseline resistance corresponding to the second electrical characteristic.

In some implementations, the memory device further includes a third MTJ having a third magnetic characteristic and a third electrical characteristic, wherein the third magnetic characteristic is distinct from the first magnetic characteristic and the second magnetic characteristic, and wherein the first MTJ, the second MTJ, and the third MTJ are arranged in series with respect to a single terminal of a transistor.

In some implementations, the respective MTJ is the first MTJ and applying the AC current to the two or more MTJs comprises applying the AC current adjusted to a write assist frequency of the first MTJ to the two or more MTJs. In some implementations, applying the AC current adjusted to a write assist frequency of the first MTJ to the two or more MTJs destabilizes and writes the first MTJ without writing the second MTJ.

In some implementations, the write assist frequency corresponding to the respective MTJ is determined based on a respective magnetic characteristic of the MTJ. In some implementations, writing the first MTJ changes a magnetic state of the first MTJ from a first magnetic state to a second magnetic state. In some implementations, the first magnetic state of the respective MTJ can be a parallel magnetic state or an anti-parallel magnetic state. In some implementations, changing the magnetic state of the respective MTJ from the first magnetic state to the second magnetic state changes a resistance of the respective MTJ.

In some implementations, the respective MTJ is the first MTJ and the MTJs store at least one bit. In some implementations, writing the first MTJ includes changing the first MTJ from the first magnetic state to the second magnetic state without changing the magnetic state of the second MTJ, which creates a second total resistance, distinct from a first total resistance, measured across the first MTJ and the second MTJ and changes a first bit to a second bit. For example, the first total resistance may be measured across the first MTJ and the second MTJ when they are both in an original state (e.g., an equilibrium state before writing to either MTJ). Each time the first or the second MTJ is written, the total resistance measured across the first and second MTJs changes. Thus, it is possible to determine, based on reading a total resistance across the two or more MTJs, the magnetic state of each MTJ. By identifying the magnetic state of each MTJ, bits can be stored in the memory device.

In some implementations, the method further comprises writing the second MTJ, including changing the first magnetic state of the second MTJ to a second magnetic state of the second MTJ without changing the magnetic state of the first MTJ, which creates a third total resistance, distinct from the first total resistance and the second total resistance, measured across the first MTJ and the second MTJ and changes the second bit to a third bit.

In some implementations, the method further comprises writing the first MTJ, including changing the second magnetic state of the first MTJ to the first magnetic state of the first MTJ without changing the magnetic state of the second MTJ, which creates a fourth total resistance, distinct from the first total resistance, the second total resistance, and the third total resistance, measured across the first MTJ and the second MTJ and changes the third bit to a fourth bit.

In some implementations, the memory device further includes a third MTJ and the method further comprises writing the third MTJ, including changing the first magnetic state of the third MTJ to a second magnetic state of the third MTJ without changing the magnetic state of the first MTJ and the second MTJ, creating a fifth total resistance, measured across the first MTJ and the second MTJ and third MTJ, distinct from the first total resistance, the second total resistance, the third total resistance and the fourth total resistance.

In some implementations, the method further comprises determining the one or more bits stored in the two or more MTJs by measuring a total resistance across the two or more MTJs. In some implementations, the total resistance across the two or more MTJs may have 2^n discrete values, where n is a number of MTJs of the two or more MTJs.

In some implementations, the method further comprises at the memory device, rewriting an initial bit stored in a respective MTJ to a desired bit, including identifying the respective MTJ that is storing the initial bit as the first MTJ adjusting the AC current to a frequency that is tuned to the write assist frequency corresponding to the first MTJ. In some implementations, the AC current is applied to the two or more MTJs and the DC current is applied to the two or more MTJs. In some implementations, changing the initial bit to the desired bit by changing the magnetic state of the first MTJ without changing the magnetic state of the second MTJ.

In some implementations, the method further comprises, at the memory device, rewriting an initial bit stored in the two or more MTJs, to a desired bit, including identifying that changing a magnetic state of the first MTJ and changing a magnetic state of the second MTJ correspond to the desired bit and adjusting the AC current to a first AC current having a frequency that is tuned to the write assist frequency corresponding to the first MTJ. The first AC current is applied to the two or more MTJs and the first DC current is applied to the two or more MTJs. Applying the first AC current and the first DC current to the two or more MTJs changes the first MTJ from a first magnetic state to a second magnetic state without changing a magnetic state of second MTJ. In some implementations, the method further comprises adjusting the AC current to a second AC current having a frequency that is tuned to the write assist frequency corresponding to the second MTJ, wherein the second AC current is distinct from the first AC current and applying the second AC current to the two or more MTJs and applying the second DC current to the two or more MTJs. Applying the second AC current and the second DC current to the two or more MTJs changes the second MTJ from a first magnetic state to a second magnetic state without changing the magnetic state of the first MTJ. In some implementations, prior to writing to the larger MTJ, the smaller MTJ is written since the latter has smaller threshold currents. In some implementations, the larger MTJ is written first using an AC component configured to provide a frequency close to the resonance frequency of the larger MTJ. Thus, in accordance with some implementations, rewriting is not needed as adjusting the AC frequency to a resonance frequency of the desired MTJ device enables writing to only the desired MTJ device (e.g., without impacting other MTJ devices).

In some implementations, a magnetic storage device is provided. The magnetic storage device (e.g., STT-MRAM 600) comprises a magnetic memory cell, comprising two or more magnetic tunnel junctions (MTJs), including a first MTJ that has a first magnetic and a first electrical characteristic and a second MTJ that has a second magnetic characteristic and a second electrical characteristic. The first magnetic characteristic is distinct from the second magnetic characteristic. The magnetic memory cell also comprises a bottom electrode and a top electrode. The two or more MTJs are arranged between the top and bottom electrode in parallel with respect to each other. In some implementations, the two or more MTJs are arranged in a vertical position. In some implementations, the space between the top and bottom electrode that does not have MTJ is filled with a dielectric material. The magnetic storage device also comprises readout circuitry (e.g., a bit line 608) coupled to the bottom electrode and/or the top electrode of the magnetic memory cell and write circuitry (e.g., word line 412 and/or source line 410) coupled to the bottom electrode and/or coupled to the top electrode of the magnetic memory cell. In some implementations, the first MTJ is smaller (e.g., narrower) than the second MTJ.

In some implementations, each MTJ of the first MTJ and the second MTJ includes a storage layer (e.g., storage layer 106 and storage layer 606). In some implementations, the first magnetic characteristic of the first MTJ is configured based on a magnetic anisotropy (e.g., HKeff) and an offset field on the storage layer of the first MTJ and the second magnetic characteristic of the second MTJ is configured based on a magnetic anisotropy and an offset field on the storage layer of the second MTJ. In some implementations, the magnetic characteristics of the MTJs are based on the material compositions of the MTJs. For example, different magnetic materials have different anisotropies, and thus a first MTJ made with a first composition would have a distinct magnetic characteristic from a second MTJ made with a second composition that is distinct from the first composition.

In some implementations, the first electrical characteristic of the first MTJ is based on a geometric property of the first MTJ and Resistance-Area product (RA product) of the first MTJ and the second electrical characteristic of the second MTJ is configured based on a geometric property of the second MTJ and an RA product of the second MTJ. For example, changing the size of the MTJ will change a resistance of the MTJ and the RA product (i.e., Resistance× Area) of the MTJ. In some implementations, the geometric property of the first MTJ is distinct from the geometric property of the second MTJ. In some implementations, the geometric property of each MTJ is selected from the group consisting of area, diameter, width, and thickness. In some implementations, the geometric property of each MTJ are distinct such that distinct levels of resistance for each MTJ are created. The resistance levels for each MTJ must be sufficiently distinct such that one can identify the magnetic state of the MTJ in order to determine the bit that is stored in the memory device.

In some implementations, each MTJ of the two or more MTJs has a distinct switching current threshold (e.g., a distinct switching current value) for changing a magnetic state of the MTJ from a first magnetic state to a second magnetic state. In some implementations, the magnetic state of the MTJ is a parallel magnetic state or an anti-parallel magnetic state. For example, the first magnetic state of the first MTJ may be parallel or antiparallel.

In some implementations, the distinct switching current threshold of each MTJ has a value determined by the magnetic characteristic of the respective MTJ. In some implementations, the switching current threshold of each MTJ is affected by variation of offset field as a function of a size of the MTJ due to stray fields from the reference layer of the MTJ. In some implementations, the offset fields further increase the differences between the distinct switching current thresholds of the MTJs. In some implementations, each MTJ has a second switching current threshold (e.g., distinct from the first switching current threshold) that corresponds to a minimum amount of voltage required to change the MTJ from the second magnetic state to the first magnetic state.

In some implementations, each of the layers in the stack of the MTJ act as tiny bar magnets, and as such each of these layers will generate a magnetic field or stray field. The reference layer in the MTJ stack is thicker than the storage layer and will generate large stray fields. Those stray fields are generally undesirable because they affect the energetics of the switching of the free layer and make the switching current characteristics asymmetric (i.e different currents to switch from P-AP and AP-P). However, in some implementations, asymmetry is desirable to increase the margins between the first MTJ and the second MTJ.

In some implementations, the MTJs are designed to tailor the stray fields. In some implementations, the reference layer is comprised of a Synthetic Antiferromagnet with two magnetic layers magnetically coupled in an antiparallel fashion (e.g., to decrease its effective magnetic moment and enhance its thermal stability). If the thicknesses of each layer in the Synthetic Antiferromagnet is chosen appropriately, the stray field can be partially cancelled out which is what is typically done in the industry. In some implementations, the thicknesses are designed to achieve a certain value of the stray field and offset the switching current of one MTJ device versus another MTJ device.

In some implementations, each MTJ has a resistance that changes in accordance with a change in the magnetic state of the MTJ.

In some implementations, the switching current threshold of a respective MTJ is based on the magnetic state and the resistance of the MTJ. While the write assist frequency does not depend on the magnetic state of the MTJ because the write assist frequency is based on inherent properties of the MTJ, the switching current threshold (e.g., the DC component) is dependent on the magnetic state and the resistance of the MTJ.

In some implementations, the switching current threshold of the first MTJ is distinct from the switching current threshold of the second MTJ based at least in part on stray fields from a reference layer of the first MTJ. In some implementations, the switching current threshold is based on a combination of the magnetic state and resistance of the MTJ, the stay offset fields of the MTJ, and other properties of the MTJ.

In some implementations, the first MTJ and the second MTJ are each in the first magnetic state, corresponding to a first resistance measured across the magnetic memory cell. For example, both the first MTJ and the second MTJ are both in a parallel magnetic state. This may correspond to the lowest total resistance measured across the memory cell.

In some implementations, the first MTJ is in the second magnetic state and the second MTJ is in the first magnetic state, corresponding to a second resistance measured across the magnetic memory cell, the second resistance distinct from the first resistance. In some implementations, the second resistance is greater than the first resistance. For example, where the first MTJ is changed to the antiparallel state and the second MTJ is still in the parallel magnetic state, this corresponds to the second lowest resistance measured across the memory cell.

In some implementations, the first MTJ is in the first magnetic state and the second MTJ is in the second magnetic state, corresponding to a third resistance measured across the magnetic memory cell, the third resistance distinct from the first resistance and the second resistance. For example, the first MTJ is in the parallel magnetic state (e.g., the first magnetic state) while the second MTJ is in an antiparallel state, which corresponds to the second highest resistance measured across the memory cell.

In some implementations, the first MTJ and the second MTJ are each in the second magnetic state, corresponding to a fourth resistance measured across the magnetic memory cell, the fourth resistance distinct from the first resistance, the second resistance, and the third resistance. For example, both the first MTJ and the second MTJ may be in the antiparallel magnetic state, which corresponds to the highest resistance measured across the memory cell.

In some implementations, the magnetic memory cell further comprises a third MTJ having a third magnetic characteristic that is distinct from the first magnetic characteristic and the second magnetic characteristic and having a third electrical characteristic, wherein the third MTJ is arranged in parallel with the first MTJ and the second MTJ. For example, the first MTJ, the second MTJ, and the third MTJ all share a single word line (e.g., word line 412). In some implementations, more than three MTJs are arranged in parallel such that the MTJs are within a single memory cell.

In some implementations, the magnetic memory cell is responsive to a first voltage pulse for writing to the first MTJ and the magnetic memory cell is responsive to a second voltage pulse for writing to the second MTJ. In some implementations, the second voltage pulse distinct from the first voltage pulse. For example, applying a DC and an AC current that corresponds to the write assist frequency for the respective MTJ allows the respective MTJ to be responsive to the voltage pulse and switch from the first magnetic state to the second magnetic state. In some implementations, the magnetic memory cell is responsive to a single voltage pulse for writing to both the first MTJ and the second MTJ.

In some implementations, the magnetic memory cell is responsive to a third voltage pulse for reading a bit from the magnetic memory cell.

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first device could be termed a second device, and, similarly, a second device could be termed a first device, without departing from the scope of the various described implementations. The first device and the second device are both electronic devices, but they are not the same device unless it is explicitly stated otherwise.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. A method comprising:
   in a memory device including two or more magnetic tunnel junctions (MTJs) including a first magnetic tunnel junction (MTJ) and a second MTJ arranged in series with respect to a single terminal of a transistor, wherein:
      the first MTJ has a first magnetic anisotropy and the second MTJ has a second magnetic anisotropy distinct from the first magnetic anisotropy;
      the first MTJ has a first write assist frequency and the second MTJ has a second write assist frequency that is distinct from the first write assist frequency;
      the first write assist frequency is based on the first magnetic anisotropy; and
      the second write assist frequency is based on the second magnetic anisotropy;
   writing to a respective MTJ of the first MTJ and the second MTJ, including:
      applying a DC current through the first MTJ and the second MTJ arranged in series with respect to the single terminal of the transistor; and
      applying an AC current to the first MTJ and the second MTJ, wherein the AC current is adjusted to a frequency that is tuned to a write assist frequency corresponding to the respective MTJ; and
   rewriting an initial value of a bit stored in the respective MTJ to a desired value of the bit, including:
      identifying the respective MTJ that is storing the initial value of the bit as the first MTJ:
      adjusting the AC current to a first AC current having a frequency that is tuned to the first write assist frequency corresponding to the first MTJ;
      applying the first AC current to the two or more MTJs;
      applying the DC current to the two or more MTJs; and
      changing the initial value of the bit to the desired value of the bit by changing a magnetic state of the first MTJ without changing the magnetic state of the second MTJ.

2. The method of claim 1, wherein:
   the two or more MTJs are perpendicular MTJs; and
   a perpendicular MTJ of the two or more MTJs comprises:
      a magnetic reference layer in a first plane, the magnetic reference layer having a magnetization vector that is perpendicular to the first plane and having a fixed magnetization direction;
      a non-magnetic spacer layer in a second plane and disposed over the magnetic reference layer; and
      a magnetic storage layer in a third plane and disposed over the non-magnetic spacer layer, the magnetic storage layer having a magnetization vector that is perpendicular to the third plane and having a magnetization direction that is same as the magnetic reference layer or that is in the opposite direction of the magnetic reference layer.

3. The method of claim 1, wherein the write assist frequency for the respective MTJ is within 20% of a natural precession frequency of a free layer of the respective MTJ determined while the free layer is in an equilibrium position.

4. A method comprising:
   in a memory device including two or more magnetic tunnel junctions (MTJs) including a first magnetic tunnel junction (MTJ) and a second MTJ arranged in series with respect to a single terminal of a transistor, wherein:
      the first MTJ has a first magnetic characteristic and a first electrical characteristic; and
      the second MTJ has a second magnetic characteristic that is distinct from the first magnetic characteristic and a second electrical characteristic;
   writing to a respective MTJ of the first MTJ and the second MTJ, including:
      applying a DC current through the first MTJ and the second MTJ arranged in series with respect to the single terminal of the transistor; and
      applying an AC current to the first MTJ and the second MTJ, wherein the AC current is adjusted to a frequency that is tuned to a write assist frequency corresponding to the respective MTJ, wherein:
         the first MTJ has a first size and the second MTJ has a second size;
         the first MTJ has a first Resistance-Area (RA) product and the second MTJ has a second RA product;
         the first electrical characteristic is based on the first RA product and the first size of the first MTJ; and
         the second electrical characteristic is based on the second RA product and the second size of the second MTJ; and rewriting an initial value of a bit stored in the respective MTJ to a desired value of the bit, including:
identifying the respective MTJ that is storing the initial value of the bit as the first MTJ;
adjusting the AC current to a first AC current having a frequency that is tuned to the first write assist frequency corresponding to the first MTJ;
applying the first AC current to the two or more MTJs;
applying the DC current to the two or more MTJs; and
changing the initial value of the bit to the desired value of the bit by changing a magnetic state of the first MTJ without changing the magnetic state of the second MTJ.

5. The method of claim 4, wherein the first electrical characteristic is distinct from the second electrical characteristic.

6. The method of claim 4, wherein the first electrical characteristic corresponds to a baseline resistance that is the same as a baseline resistance corresponding to the second electrical characteristic.

7. The method of claim 4, wherein the memory device further includes a third MTJ having a third magnetic characteristic and a third electrical characteristic, wherein the third magnetic characteristic is distinct from the first magnetic characteristic and the second magnetic characteristic, and wherein the first MTJ, the second MTJ, and the third MTJ are arranged in series with respect to the single terminal of the transistor.

8. The method of claim 1, wherein:
the respective MTJ is the first MTJ; and
applying the AC current to the two or more MTJs comprises applying the AC current adjusted to the write assist frequency of the first MTJ to the two or more MTJs.

9. The method of claim 8, wherein applying the AC current adjusted to the write assist frequency of the first MTJ to the two or more MTJs writes the first MTJ without writing the second MTJ.

10. The method of claim 1, wherein the write assist frequency corresponding to the respective MTJ is determined based on a respective magnetic characteristic of the respective MTJ.

11. The method of claim 1, wherein writing the first MTJ changes a magnetic state of the first MTJ from a first magnetic state to a second magnetic state.

12. The method of claim 11, wherein the first magnetic state of the respective MTJ can be a parallel magnetic state or an anti-parallel magnetic state.

13. The method of claim 11, wherein changing the magnetic state of the respective MTJ from the first magnetic state to the second magnetic state changes a resistance of the respective MTJ.

14. The method of claim 1, further comprising:
after changing the initial value of the bit to the desired value of the bit:
adjusting the AC current to a second AC current having a frequency that is tuned to the second write assist frequency corresponding to the second MTJ, wherein the second AC current is distinct from the first AC current;
applying the second AC current to the two or more MTJs; and
applying a second DC current to the two or more MTJs;
wherein applying the second AC current and the second DC current to the two or more MTJs changes the second MTJ from a first magnetic state to a second magnetic state without changing the magnetic state of the first MTJ.

* * * * *